(12) United States Patent
Arnvidarson

(10) Patent No.: US 8,259,300 B2
(45) Date of Patent: Sep. 4, 2012

(54) INTERFEROMETER ACTUATOR

(75) Inventor: Börkur Arnvidarson, Reykjavik (IS)

(73) Assignee: ChemoMetec A/S, Allerod (DK)

( * ) Notice: Subject to any disclaimer, the term of this patent is extended or adjusted under 35 U.S.C. 154(b) by 314 days.

(21) Appl. No.: 12/596,206

(22) PCT Filed: Apr. 21, 2008

(86) PCT No.: PCT/DK2008/050091
§ 371 (c)(1),
(2), (4) Date: Jan. 22, 2010

(87) PCT Pub. No.: WO2008/128547
PCT Pub. Date: Oct. 30, 2008

(65) Prior Publication Data
US 2010/0149542 A1   Jun. 17, 2010

(30) Foreign Application Priority Data

Apr. 18, 2007  (DK) .................................. 2007 00569
May 18, 2007  (DK) .................................. 2007 00740

(51) Int. Cl.
*G01B 9/02* (2006.01)
(52) U.S. Cl. ........................................................ 356/450
(58) Field of Classification Search .................. 356/450, 356/521; 359/290, 291, 577, 578
See application file for complete search history.

(56) References Cited

U.S. PATENT DOCUMENTS

| | | | |
|---|---|---|---|
| 4,480,914 A | 11/1984 | Thompson et al. | |
| 5,883,712 A | 3/1999 | Coffin | |
| 6,538,747 B1 * | 3/2003 | Arnold | ........................ 356/512 |
| 2001/0030753 A1 | 10/2001 | Ge | |
| 2002/0089259 A1 * | 7/2002 | Iino et al. | ...................... 310/325 |
| 2005/0195408 A1 | 9/2005 | Phillips | |
| 2006/0088074 A1 | 4/2006 | Johnstone et al. | |
| 2008/0252897 A1 * | 10/2008 | Arnvidarson et al. | ........ 356/452 |

FOREIGN PATENT DOCUMENTS

| | | |
|---|---|---|
| EP | 0702205 A2 | 3/1996 |
| JP | 08178614 A * | 7/1996 |
| WO | WO-2004018964 A1 | 3/2004 |

OTHER PUBLICATIONS

Michelson, A.A. 1891, "Visibility of Interference-Fringes in the Focus of a Telescope", Phil. Mag. 5, vol. 31, pp. 256-259.

* cited by examiner

*Primary Examiner* — Michael A Lyons
(74) *Attorney, Agent, or Firm* — Gifford, Krass, Sprinkle, Anderson & Citkowski, P.C.

(57) ABSTRACT

The invention relates the movement of at least one movable means of an interferometer relative to the body of the interferometer. The system according to the invention, comprises at least two interferometer actuators, that can be operated individually, so that the at least two actuators are capable of moving the at least one movable means of the interferometer. When activating at least one of the at least two interferometer actuators the at least one movable means of the interferometer is moved with a minimum need for correcting for e.g. tilt. In a preferred configuration the system and the method according to the invention comprises three interferometer actuators that can be operated individually.

23 Claims, 10 Drawing Sheets

A

B

C

A

B

A

B

C

D

A

B

INTERFEROMETER ACTUATOR

CROSS-REFERENCE TO RELATED APPLICATIONS

This application is the U.S. national phase of PCT/DK2008/050091 filed Apr. 21, 2008, which claims priority of Danish Patent Application Nos. PA 2007 00569 filed Apr. 18, 2007 and PA 2007 00740 filed May 18, 2007.

FIELD OF THE INVENTION

The present invention relates to a method and a system for the generation of interference of electromagnetic information, such as typically generated in an interferometer.

DESCRIPTION OF THE RELATED ART

Interference spectrophotometers have in recent years become the preferred tool in spectrophotometric investigation. The phenomenon of interference has been known for a long time and as early as in 1891 Michelson designed an optical interferometer (A. A. Michelson, *Phil. Mag.* (5), 31, 256, 1891). The advantages of the method of interferometry, e.g. in the fields of spectroscopic analysis such as Far-Infrared, Mid-Infrared Near-Infrared, Raman and Nuclear Magnetic Resonance have been demonstrated in numerous instruments of later date. These instruments take full advantage of mechanical, electronical and software capabilities of modern technology.

Still one drawback of state of the art instruments, in particular instruments which employ moving parts as means of generating interference, e.g. mirror in an optical interferometer, is the limited mechanical stability of such interferometers with respect to the environment, e.g. movement, shock and vibration. The nature of methods and systems employed allows external mechanical forces, of magnitude similar to what is typically encountered in office, laboratory or production environment to affect the position of the interference generating means. The effect of such alteration in position, although small by most measures, e.g. few nm (nanometers), often compromises the performance of the instrument even to an extent that renders the instrument inoperable under such conditions. This is for instance the case when it becomes virtually impossible to correlate measured signal to degree of modulation, e.g. interference position. In order to operate the instruments in such environment several implementations have been employed, ranging from mechanical stabilisation of the different elements of the interferometer, through the stabilisation of the interferometer or instrument itself, to altogether removal of the instrument from the location and instead bringing the sample and/or signal from the instrument into contact with the sample through remote means.

Often it is difficult to establish conditions, such that the interferometer can be operated, typically when an interferometer is operated in the field, e.g. outside laboratory environment and rarely are such arrangement practical. It is for instance difficult to operate interferometers in moving vehicles, such as automobile, ships or aeroplanes. Also handheld operation of an interferometer is difficult to realise. In some cases vibrational stabilising measures even further contribute to these difficulties, due to increased weight and or size of the instrument.

Movable means for the generation of interference, e.g. movable minors of a Michelson Interferometer, must move with great precision and accuracy in order for the conventional interferometer to operate properly. Minute deviation from the intended position or alignment, e.g. tilting, often as small as one or few nanometres, can have significant effect of the resulting interference. It is evident that many mechanical constructions lack the stability which is necessary to not display such displacements even at low or moderate force, e.g. such as is observed due to ambient noise or closing of a door in a laboratory. Naturally, it is a logical consequence that the design of the movable means is made such, that it can withstand such force, but in practical application this has proven difficult, since such ruggedness or stiffness of the construction must be matched by the force used to move the movable means in order to facilitate the movement. Therefore the construction typically becomes a compromise between the force used to brace the construction and the force used to cause it to move.

Designs which have been successfully applied as solution to this problem often omit the use of movable means, for instance by generating stationary interference which is detected by an array of sensors in spatial arrangement, as opposed to use a single detector to register interference which is not stationary in time. Other designs implement the "movement", e.g. Optical Path Difference in a Michelson interferometer, through rotation, rather than linear translation, a design which often improves resistance to linear interference while not improving tolerance to rotation or radial movements, such designs rarely offering simple and compact systems.

To further improve stability of movement, both against environmental effects, but also to compensate for mechanical imperfection, several embodiments of interferometry comprise secondary means for movement, in addition to the primary or driving means. The function of the secondary means is to facilitate fast movement over short distance, thus correcting imperfection in the movement of the primary movement means. Such secondary movement means are intended to produce minute adjustments needed to improve the movement and/or alignment preformed by the primary movement means. Two examples of such implementations are given in U.S. Pat. No. 4,480,914 and U.S. Pat. No. 5,883,712. Since such secondary correction means are intended to adjust the position produced by the primary means, it is often a preferred feature to use means which allow fast movements, for instance such as can be produced by piezoelectric material. Common for interferometers including such secondary adjustment means is that when such system usually offers good compensation against interferences of slow nature, interference such as shock or vibrations at several frequencies are poorly or not compensated for at all.

SUMMARY OF THE INVENTION

Using several embodiments of the present invention it has surprisingly been found that it is possible to design, construct and operate interferometer employing interferometer actuator(s), such as linear actuators or bender actuators, for the movement of the movable means of the interferometer, where excellent performance with respect to alignment and position of a movable means are obtained, even under conditions where the movement of the movable mean relative to the reminder of the interferometer is extensive. Several of the highly preferred embodiments of the present invention comprise actuator means for the movement of the movable means, many of these preferred embodiments using said actuator means both for the actuation and control of the movable means.

Accordingly, in one aspect the present invention relates to a method for the movement of at least one movable means of an interferometer relative to the body of the interferometer, comprising arranging at least two interferometer actuators, wherein said at least two interferometer actuators can be operated substantially individually, so that the at least two actuators are capable of moving the at least one movable means of the interferometer, activating at least one of the at least two interferometer actuators thereby moving the at least one movable means of the interferometer.

In another aspect the present invention relates to a system for the movement of at least one movable means of an interferometer relative to the body of the interferometer, comprising at least two interferometer actuators, wherein said at least two interferometer actuators can be operated substantially individually, so that the at least two actuators are capable of moving the at least one movable means of the interferometer, means for activating the at least two interferometer actuators thereby moving the at least one movable means of the interferometer.

By the term "actuator" is meant a mechanical, pneumatic, hydraulic or electrical device that performs a deformation or motion when being activated by an input signal, which may be electric or fluidic, such as a piezoelectrical element. In the present context a bender arrangement may comprise several actuators such as shown in FIG. 2 A or FIG. 2 B. Furthermore, a segmented bender comprises two or more actuators, such as shown in FIG. 3 B.

An interferometer, such a Michelson interferometer, contains a number of elements, such as mirrors, beamsplitter or lenses. These elements are arranged relative to each other in accordance with the property of the different interferometer design, each in turn having different properties. In the following the term "Interferometer Body", refers to the housing, in which at least some of the different optical elements are arranged, typically in a fixed manner, securing them from unintentional movement and providing strength against mechanical interferences, such as vibration or shock.

One highly preferred feature of the present invention, comprising two or more interferometer actuators contributing to the movement of a movable means, such as a movable means containing a mirror in a Michelson interferometer, is the possibility to controlling such two or more interferometer actuators individually, e.g. where each actuator is activated through an independent signal, or substantially individually, e.g. where two or more actuators are fed substantially identical main signal and in addition where at least one of the actuators is fed a control signal, such as a control signal reflects difference in actuation. The effect of operating interferometer actuators individually in the present invention, preferably result in an effect of the movement of the movable means of an interferometer in substantially predetermined manner, thus individual actuation of individual actuators produce effect on the movement of the movable means of the interferometer, thus in turn producing an effect on any optical means in attachment with the movable means, for instance a mirror or a beamsplitter. Therefore in embodiments of the present invention, the individual controlling of interferometer actuators affects the movement of the movable means in a manner, which results in a predetermined movement behaviour, such as tilting during movement, as well as producing, or at least contributing substantially to the translation of the movable means, e.g. movement along a line or a predetermined path.

A preferred property of actuator means in the present invention is the ability to simultaneously supplying force which restrain or fix the movable means of an interferometer relative to the interferometer body, making it stable against mechanical interference such as shock or vibration, and also supply the force to move the movable means of an interferometer without substantially compromising resistance to mechanical interference.

Many preferred embodiments of the present invention comprise piezoelectric actuators as actuator means. Such preferred piezoelectric means are piezoelectric crystals, or piezoelectric ceramics, such as stacked piezoelectric actuators. Many other preferred piezoelectric means comprises stacks of piezoelectric actuators and/or piezoelectric benders.

The traditional design of a piezo-bender used as actuator is to deposit a layer of active piezoelectric material on a solid substrate, causing movement of opposing ends of the bender by applying voltage across the piezoelectric material. The solid substrate largely defines the mechanical stability of the bender actuator. The voltage affects the physical property of the piezoelectric material causing it to change it ratio between height and width. Thus if the height of the layer of piezoelectric material increases its length along the substrate is shortened. If the substrate does not subtract to the same extent as the piezoelectric material then a force is formed on the surface of the support material. If the construction is flexible, e.g. if it can bend, then this force can cause deformation of the construction, causing it to bend along its surface. Similarly it is possible and generally preferred to make piezo-bender that can realise movement to the other side, thus allowing bending in both directions (back-and-forth). Such movement caused by a bender is in the following termed stroke and the length of the movement in a single direction is termed stroke length.

In the current context the term bender typically refers to a bender unit capable of producing movement, e.g. stroke, preferably double layer benders producing movement in two ways, back and forth. Further bender arrangements include a number of individual benders, which are operated in parallel, e.g. the movement, e.g. stroke length, of the bender arrangement is substantially equal to the movement of each of the individual benders in the arrangement. A bender arrangement is therefore typically considered to perform as a single bender, preferably with added properties such as mechanical stability, e.g. strength or vibrational stability, or parallel movement, e.g. tilting.

There are several constructions of piezo-benders that are preferred in the different embodiments of the present invention, but in the following circular benders, e.g. disk benders are mainly discussed, in order to simplify the discussion. This does not exclude other types of benders, as several embodiments of the present invention are equally suitable for such benders. In movement a bender can be considered to have a fixed point, e.g. a point of fixation, and then it is generally assumed that this is fixed relative to the body of the interferometer. Further a bender is considered to have moving point, e.g. point of movement, and then it is generally assumed that the movable means of the interferometer are in an attachment with this point. Here the term point extends to the entire attachment, which for instance can be a point, a line, segmented line, or a circle or a part of a circle. In general such point refers to attachment of the bender.

The movement of the ideal bender causes the edges of the bender to move in parallel. When considering the general form of a bender this is illustrated by tangents to two edges, which initially are parallel to each other, e.g. considering circular bender these edges are for instance on opposite radial positions of the disk. Under ideal conditions these tangents remain parallel during the movement of the bender, the movement only causing them to move relative to each other while maintaining the initial direction. If the bender operates in non-ideal manner then the two tangents can change direction relative to each other, for instance if one bending-side of a rectangular bender bends differently from the other bending-side, then tangent to the free side will change direction relative to a tangent to the opposite, or fixed edge as the bending occurs, e.g. the bender is twisted since the two bending sides bend differently. The extent of deviation from this ideal bending will typically be expected to increase with increasing bending.

While benders are preferred in several embodiments of the present invention, other equally preferred embodiments comprise linear actuators as interferometer actuator. Typically a linear actuator has superior mechanical strength in the direction of movement than has a bender actuator, while the mechanical strength of the bender is typically greatest in the direction perpendicular to the movement.

One often preferred property of embodiments of the present invention is the vibrational stability of the movable means during movement, obtained through the mechanical strength of the interferometer actuator. Such vibrational stability of the movable means can be expressed in the frequency of the lowest harmonic frequency of the movable means, relative to the interferometer body. It is typically preferred to have such lowest harmonic frequency at or above 100 Hz, such as at 200 Hz or higher, preferably at 500 Hz or higher, such as 1,000 Hz. Further several embodiments have lowest harmonic frequency of the movable means, relative to the interferometer body at frequencies above 1 kHz, such as at 2 kHz or higher, such as 5 kHz or higher, preferably 10 kHz or higher, such as 20 kHz or higher.

In several embodiments of the present invention, it is preferred that the movement of the bender is brought about by a single piezoelectric bender. In some of these implementations it is preferred to use a disk bender. This is in particular when the parallel property of the movement is good, defined as small deviation from parallel movement of the movable mean, e.g. tilting of an optical component, relative to the maximum displacement of the movable means, for instance when goodness is expressed as tilting in mrad (mille radians). A good parallel property is preferably 0.2 mrad or less, such as 0.1, 0.05 or 0.01 mrad or less. Still in other equally preferred embodiments the deviation from parallel movement is more than 0.2 mrad, such as 0.4 mrad or 0.8 mrad or even more than 1.0 mrad. In many embodiments the requirements of parallel property are dependent on the wavelength of the light being measured and/or the method used to extract information from the measured interferogram. Typically there is positive correlation between the wavelength of light and the goodness of parallel movement.

In other embodiments, it is preferred to use two or more piezoelectric benders in order to assure good parallel property. In embodiments of the present invention using two or more individual benders it is preferred that the arrangement of these benders substantially eliminates the inherent angular tilting of the bender.

In several embodiments of the present invention where two benders are used, the benders are arranged in a manner where the fixed points and the movable points are substantially in alignment, e.g. on a line. In some preferred embodiments the movable points of the two benders are situated close to the centre of the two fixed points, while in other embodiments the fixed points are in vicinity of each other and the movable points are situated at the extreme of the bender arrangement, while in still other embodiments the benders are arranged in the same orientation, where one of the bender has its fixed point situated at the extreme and the other bender has its movable point situated at the extreme of the bender arrangement (see Example 1 and FIG. 1 for further explanation). These different arrangements represent in summary an arrangement with different distance between the two movable points, which is of interest when considering the degree of tilting along the line of the bender arrangement, caused by difference in stroke length of the two benders. In other embodiments of the present invention where two benders are used, the benders are arranged in a manner, where the fixed points and movable points are substantially not in alignment. This is illustrated in one particular embodiment where the four points form a square or a rectangle, preferably where the two fixing points are on the diagonal of the square of rectangle.

In embodiments of the present invention where three benders are used, it is preferred that the movable points of the benders are arranged in such a manner that they are substantially not all three on a line. In such embodiments it is preferred that the movable points are arranged in such a manner that they form a triangle, preferably a triangle with sides of similar length, such that the ratio of the shortest to the longest side is between 1:1 and 1:10. One preferred property of triangular arrangement with substantially equal sides is reduction of tilting from difference in stroke length among the benders. For discussion on the arrangement of three interferometer actuators, such as benders, refer to Example 2 and FIG. 2.

It is often preferred that arrangement of piezoelectric benders, used for the movement of a movable means of an interferometer, has a symmetrical or rotational symmetrical form, e.g. a disk or a triangle or generally a polygon, since this often has substantially positive impact on the nature of the movement, e.g. parallel movement. In general, when considering an arrangement of two or more benders it is often a preferred embodiment of the present invention to include the bender arrangement on the same substrate material forming a segmented bender, representing each bender as an individual bender element. Preferably such segmented benders are produced in a manner traditionally used for the production of piezoelectric benders. One often preferred property of such segmented piezoelectric bender is its inherent mechanical stability with respect to shock and/or vibration in several directions, often in such a manner that the mechanical stability against forces in directions other than the direction of the stroke is substantial relative to the inherent mechanical stability of the bender in the direction of the stroke.

Several preferred embodiments of the present invention use two or more benders or bender arrangements in series for the movement of a movable means of an interferometer, for the purpose of increasing the overall stroke length of the bender arrangement. Each of such two or more benders in series can consist of a set of individual benders in arrangement, preferably where the bender arrangement substantially improves the parallel nature of the movement and/or increases the mechanical stability of the arrangement. Many of these embodiments include at least one segmented bender. The benders or bender arrangements in series need not be identical in form or function. Preferably the stroke length of the assembly of benders or bender arrangements in series is substantially equal to the sum of the stroke length of the individual benders or bender arrangements.

Several preferred embodiments of the present invention use two or more benders or bender arrangements in parallel for the movement of a movable means of an interferometer, for the purpose of increasing the mechanical stability of the movable means, e.g. resistance to vibrations from the environment. Each of such two or more benders in parallel can consist of a set of individual benders in arrangement, preferably where the bender arrangement substantially improves the parallel nature of the movement and/or increases the mechanical stability of the arrangement. Many of these embodiments include at least one segmented bender. Preferably at least two benders are attached to the movable means, in a manner which reduces the sensitivity to external forces, such as forces causing tilt or rotation of the movable means. Further preferably at least two benders are attached to the movable means, in a manner which reduces deviation from parallel movement of the movable means, such as an attachment at points which are substantially separated in the direction of the stroke of the benders.

Although linear actuators often show good stability against tilting during movement, several preferred embodiments of the present invention, comprising linear actuators as interferometer actuator, use two or more individual linear actuators in arrangement where two or more such actuators contribute to the movement of a movable means, preferably where the effect of the use of two or more linear actuator is improvement stability against tilting of the movable means. Preferably improved stability is obtained by operating at least two actuators individually.

In the context of the present invention, movable means refer to one or more part of an interferometer, in arrangement with the interferometer house, such that it can move relative to the interferometer house, the movement of said movable mean giving rise to the modulation of light passing the interferometer.

Movable means of an interferometer is a minor in several preferred embodiments of the present invention, preferably moving in a direction perpendicular to the mirroring surface of the mirror, e.g. substantially in the direction of incoming light. In other equally preferred method of the present invention movable means of an interferometer is a beamsplitter, e.g. a partial reflector which allows substantial fraction of incident light to transmit, preferably where the ratio between transmitted and reflected light is approximately 1/1.

In several embodiments, the interferometer contains only one movable means, but in other and equally preferred embodiments the interferometer contains more than one movable means, in which case two movable means can be of identical types, for instance two minors, or they can be of a different type such as a minor and a beamsplitter.

One preferred embodiment of the present invention for the use of two or more benders bender elements for the movement of movable means, includes applying different electrical force to at least two bender elements (electrical force referring to voltage, typically changing with time, thus causing movement). The purpose of applying different electrical force is preferably to improve the performance of the movement, typically with respect to parallel nature of the movement, of the movable means of the interferometer. This can be of interest when the two or more benders have difference response to actuation, e.g. electrical force. By applying individual force to the two or more benders the different properties of the benders, e.g. response to actuation, can be controlled, preferably where the property of the individual electrical forces are predefined in such a manner that parallel movement of the bender is obtained. Another equally preferred embodiment of the present invention includes applying electrical force to at least two individual piezo-benders, preferably where said piezo-benders are arranged in such a manner that the edge or a tangent to the fixed and/or moving edge of the bender is substantially not parallel. Said electrical force being applied to two or more piezo-benders being identical, preferably where electrical force being applied to at least one of the two or more piezo-benders being different from another electrical force(s), preferably where difference in electrical force results in a equal or substantially equal movement of all moving edges or tangents to moving edges. An illustration of an often preferred effect of such application of electrical force, is for instance if one side of the bender moves faster than another side under given conditions, causing the movable means to tilt, then less force is applied to this side under these conditions, thus causing all/both sides to move at substantially equal speed and thus move parallel.

The use of piezoelectric benders for the generation of interference in an interferometer, such as a Michelson interferometer, offers several advantages. One advantage is the possibility to attach two minors to the piezoelectric bender. Firstly the mirrors can be attached to the same side of the movement system, but secondly it is possible to have mirrors on both sides of the movement system. One property of piezoelectric benders, which makes this feasible, is the relatively small thickness of the system along the axis of movement. These minors will travel in same manner, with respect to movement and tilting. Such system can make use of both flat minors and mirrors such as cubic-corner minors, either using same type on both sides or different types. Using mirrors on opposite sides it is possible to produce greater optical path difference (OPD) using the same linear movement of the movement system, e.g. stroke length. One implementation of this feature is to reflect light in both arms of the interferometer from the same movement means, but with minors on opposite sides. This would typically generate twice as long OPD compared to only reflecting light in one of the arms, as is the typical implementation, for instance in a Michelson interferometer.

One use of the feature of two mirrors is to perform position determination or control by using one of the mirrors for the position determination (often monochromatic light such as laser, laser diode or LED's), while the other minor is used in conventional manner. One advantage of such arrangement is that the optical system of the interferometer, concerning the light being modulated, does not have to accommodate means for the positioning system.

Another implementation using two minors on the same movement system is that it is possible to implement a dual beam spectrophotometer using a single movement system. This would typically be implemented by directing light from the light source to two virtually identical interferometers, sharing the same movement means, where light in one of the interferometers would interact with the sample under consideration, while the light in the other interferometer would represent background conditions. This feature is commonly used in spectroscopy, other than state of the art Fourier Transform spectrophotometers, and allows the measurement of sample and sample background simultaneously, which often improves stability and sensitivity of a spectrophotometer.

Further the use of two mirrors on the same movement system makes it possible to perform separate spectral analysis simultaneously. It is, for instance, possible to measure different spectral regions at the same time, such as mid-IR and near-IR. This greatly extends the analytical capability of an instrument, without substantially increasing the requirements to the movement system.

It has been found, that it is possible through several preferred embodiments of the present invention, to construct an interferometer, which facilitates magnitudes of Optical Path Difference (OPD), e.g. in a Michelson or Fabry-Perot interferometer, of the order of 100 µm or more, such as 200 µm or more, or even 400 µm or more such as 800 µm or more, brought about by one or more piezoelectric actuator(s), e.g. a piezoelectric bender, while maintaining mechanical stability against linear and rotational forces of predominant frequencies in the range from below 100 Hz to more than 1,000 Hz, and some embodiments of the present invention maintain mechanical stability against linear and rotational forces of predominant frequencies of more than 1,000 Hz, such as 2,000 Hz or more, even 10,000 Hz or more. Over these predominant frequency ranges several preferred embodiments show good or even excellent resistance against acceleration levels of more than 0.1 g, such as 0.2 g or more, such as 0.3 g or more, even certain embodiments can withstand accelerations of 0.5 g or more. Under these conditions the movable means of the interferometer, allow it to maintain stable position relative to the remainder of the interferometer within a distance of 100 nm, such as within 50 nm, or even within shorter distance such as 20 nm, 10 nm or even 5 nm, where stable position is both stationary position, e.g. where the movable means are at standstill, and precision of dynamic position, e.g. position during intentional movement of the movable means. Similarly the movable means of the interferometer can maintain alignment relative to the remainder of the interferometer such that angular deflection is less than 1 milliradian (mrad), such as 0.5 mrad or less, such as 0.2 mrad or less, even less than 0.1 mrad such as 0.05 mrad 0.02 mrad or less than 0.01 mrad.

In many of the preferred embodiments of the present invention, the interferometer actuator(s) are operated, e.g. driven, using electrical signal, such as voltage or current. In many such embodiments it is preferred to generate such electrical signal using Digital/Analogue Converter (DAC), preferably DAC's with substantially high resolution, such as 16 bits, preferably even more than 16 bits such as 20 bits or even 24 bits. The preferred resolution being determined in accordance with the application at hand.

One preferred property of several embodiments of the present invention is the ability to produce the same movement for a number of times, or over a prolonged time. The effect of this property is that it is possible to determine a pattern of movement, where two or more interferometer actuators are controlled individually, where the result of such pattern is an improved parallel movement of movable means of an interferometer, e.g. reduction of tilting. Thus it is possible to predetermine a pattern of movement, and subsequently repeat this pattern without any, or substantially any, modifications to the pattern, without substantially degradation of the movement property. Such property reduces substantially the need for real-time means for the determination of movement property, such as tilt or even position, even to the extend where such means are only needed for the initial determination of such movement pattern.

Embodiments of the present invention are often preferred in the implementation of equipment for quantitative and/or qualitative analysis of chemical and/or physical properties of samples, such equipment facilitating methods such as spectral analysis, e.g. the determination of spectral properties, identification of chemical components, determination of the amount of chemical component in a sample, determination of physical property of a sample. Several embodiments of the present invention are preferred in implementation of low-resolution spectroscopic methods, e.g. where obtainable spectral resolution is less or considerably less than general resolution of spectral features. Embodiments of the present invention are preferred in the implementation of interference spectrophotometers, such as Michelson interferometer or Fabry-Perot interferometer. The mechanical properties of several embodiments of the present invention make it possible to construct an interferometer which can withstand severe mechanical influences, such as vibration and shock. Thus preferred embodiments are included in interferometers intended for applications such as hand-held interferometers, or interferometers intended for use in vehicles, such as cars, ships, airplanes and helicopters.

DESCRIPTION OF THE INVENTION

Figure 1:
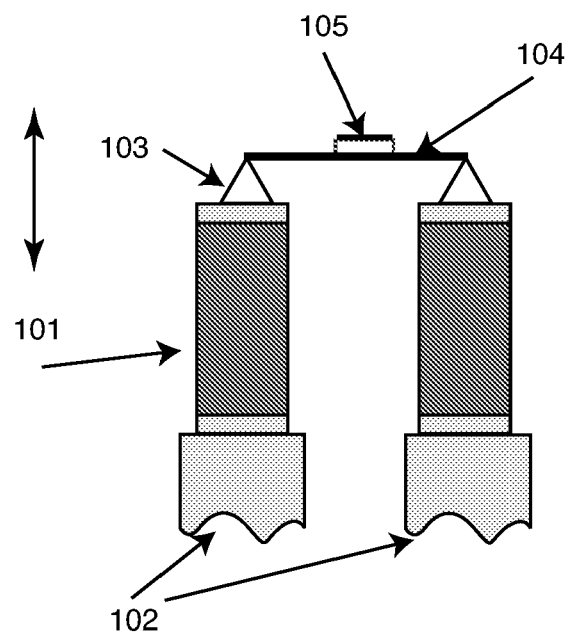
FIG. 1 illustrates arrangement of two interferometer actuators.
Figure 1:
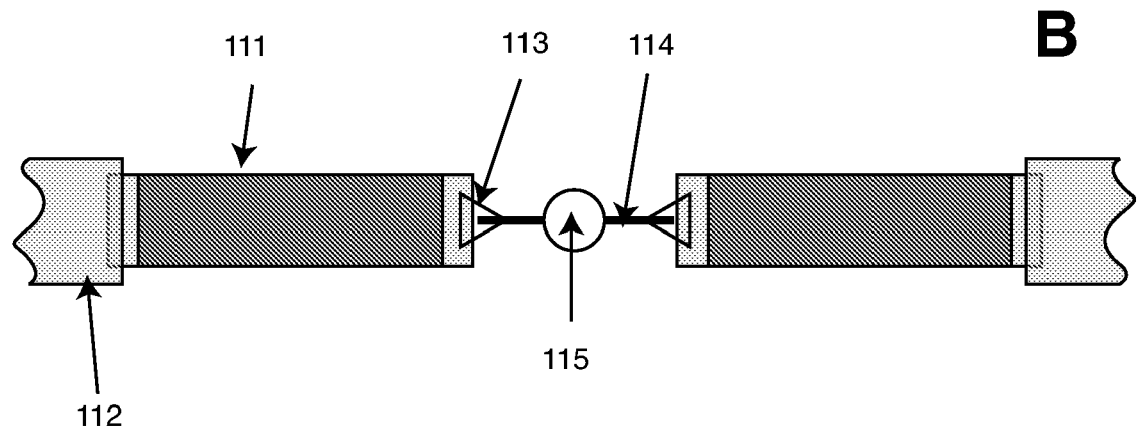
Figure 1:
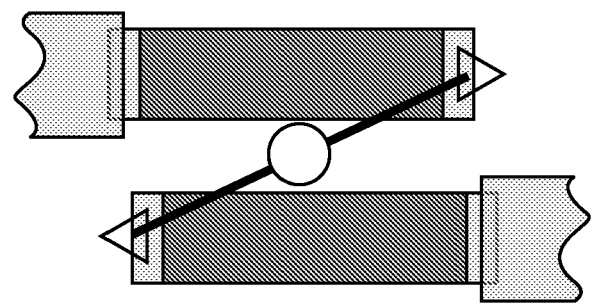

The present invention relates to a method and a system for the movement of the movable means of an interferometer relative to the body of the interferometer. At least two interferometer actuators that can be operated substantially individually are arranged so that when activated they are capable of moving movement the movable means. The interferometer actuators are activated by applying electrical field causing them to bend, said bending causing said movable means to move relative to said interferometer body.

In several preferred embodiments of the present invention the number of interferometer actuators are 2. This is often preferred for the purpose of stabilising the tilt of the moving point of the actuator, if the bending causes an angular tilt of this point relative to the fixed point of the interferometer and/or when high strength of the interferometer actuator is a desired property. Preferably the at least two interferometer actuators that can be operated substantially individually are piezoelectric actuators, preferably piezoelectric benders, preferably a dual-layer bender. In other equally preferred embodiments of the present invention one or more such interferometer actuator(s) is/are a linear actuator.

Further in other equally preferred embodiments of the present invention the number of interferometer actuators are 3. The use of 3 actuators for the movement of the movable means of an interferometer is typically preferred under conditions where small tilting of the movable means and/or high strength of the interferometer actuators is a desired property. Preferably one or more such interferometer actuator(s) is/are a piezoelectric actuator, preferably a piezoelectric bender. In other equally preferred embodiments of the present invention one or more such interferometer actuator(s) is/are a linear actuator.

When using two or more interferometer actuators to produce a movement it is often preferred that the interferometer actuators are operated in substantially same manner, including substantial simultaneous movement in same direction and if the stroke of the actuators causes the movement of a common point then their movement, e.g. stroke length, should be of substantially same length. In several of these embodiments it is preferred that two or more interferometer actuators are substantially identical in design and construction, for instance when this causes more identical movement of each actuator. Further in several of these embodiments, preferably where the interferometer actuators are benders, such as piezoelectric benders, causing movement in a direction substantially not parallel to the longest dimension of the actuator, it is preferred to arrange benders in a manner that they are at an angle to any other interferometer actuator, preferably where the angle between adjacent interferometer actuators is substantially identical, since such arrangement generally produces a more parallel combined movement of the movable means of the interferometer, these angles referring to angles between the longest dimensions of the actuators.

In several embodiments using two or more interferometer actuators it is preferred that interferometer actuator controlled individually for the purpose of controlling movement, such as tilting, contributes substantially to the translation of the movable means, preferably at least 25% or more, such as 50% or more. Even in many preferred embodiments the translation of the movable means is entirely brought about using interferometer actuator(s) controlled individually. In other embodiments, it is preferred that such interferometer actuator contributes at the most 30% of the translation, such as 15% or less, preferably 10% or less. Nevertheless some preferred embodiments of the present invention include interferometer actuator(s) controlled individually for the purpose of controlling movement, such as tilting, contribute substantially not to the translation of the movable means of the interferometer. Many of these preferred embodiments, further include 1 or more interferometer actuator(s), substantially only contributing to the translation of the movable means, preferably where such actuators are substantially only controlled for the purpose of controlling translation, e.g. the position, of the movable means of the interferometer. Preferably one or more such interferometer actuator(s) is/are a piezoelectric actuator, preferably a piezoelectric bender. In other equally preferred embodiments of the present invention one or more such interferometer actuator(s) is/are a linear actuator.

Many preferred embodiments of the present invention include the use of piezoelectric bender as interferometer actuator, comprising two or more piezoelectric bender elements on the same bender support, e.g. a segmented bender. Preferably bender elements of such segmented bender can be activated substantially independently, e.g. by controlling the driving voltage applied to each bender segment substantially independently. Typically such individual control of bender segments has the purpose of controlling tilting of the bender or movable means of an interferometer. In many of these embodiments it is preferred that the support is circular, since such construction often can facilitate more simple assembly but also improved mechanical strength of the bender. In order to obtain improved control of tilting it is preferred in many of the embodiments to include three piezoelectric segments on such bender. Often it is preferred that the bender elements are aligned in such a manner that the direction from the fixed point to the moving point of the bender is parallel, in particular when the bender elements are in symmetric or rotational symmetry alignments that the direction is in radial alignment. Further it is preferred the such segmented bender is produced in such a manner as to facilitate requirements to the bender, such as applying piezoelectric bender element on both sides of the support, preferably in a substantially the same configuration on both sides when considering size, shape and position. Further it is generally preferred that the bender support is substantially solid along the direction from the fixed point to the moving point, in order to allow improved mechanical stability, while often it is preferred that the bender support is also segmented, preferably where the fixed points of the bender and/or the moving points of the bender are in firm connection. For instance when considering a disk bender, such segmented support material is typically solid along its outer and/or inner rim, thus allowing mechanical stability against forces perpendicular to the radius of the bender, while the support is segmented along the boundaries of the bender elements, in radial fashion.

The segments of a segmented bender support can be defined by the parallel or radial boundaries of the bender elements.

A piezoelectric bender or bender arrangement according to the present invention produces a stroke length substantially equal to the stroke length of each of the benders or bender elements, since they are typically operated in series, in the current context the term 'series' does not refer to the physical orientation, but to the effective translation of each actuator, such that the translation of the actuators is substantially opposite in direction. Many preferred embodiments of the present invention further include an arrangement of two or more interferometer actuators, such as benders or bender arrangements, where the effective stroke length is substantially the sum of the stroke length of the at least two interferometer actuators, such as benders or bender arrangement. Such increased stroke length preferably results in an increased movement of the movable means of the interferometer. Preferably the stroke length of two or more interferometer actuators in series is longer than 50 µm, such as 100 µm, more preferably longer than 100 µm such as longer than 200 µm, longer than 400 µm, longer than 1,000 µm, such as longer than 2,000 µm. Even preferred embodiments of the present invention include interferometer actuators in series, such piezoelectric benders or bender arrangements in series, which can produce combined stroke length of more than 3,000 µm, such as 5,000 µm or more, preferably 10,000 or more, such as 20,000 µm or more.

Several preferred embodiments of the present invention use two or more interferometer actuators, such as piezoelectric benders or bender arrangements, in parallel for the movement of a movable means of an interferometer, for the purpose of increasing the mechanical stability of the movable means, e.g. resistance to vibrations from the environment, in this context the term 'parallel' refers not to the physical arrangement or orientation, but to the translation of the actuators, e.g. translation which is substantially equal in length and direction. Each of such two or more benders in parallel can consist of a set of individual benders in arrangement, preferably where the bender arrangement substantially improves the parallel nature of the movement and/or increases the mechanical stability of the arrangement. Many of these embodiments include at least one segmented bender. Preferably at least two benders are attached to the movable means, in a manner which reduces the sensitivity to external forces, such as forces causing tilt or rotation of the movable means. Further preferably at least two benders are attached to the movable means, in a manner which reduces deviation from parallel movement of the movable means, such as an attachment at points which are substantially separated in the direction of the stroke of the benders.

In one embodiment, the present invention comprises at least two benders arranged in parallel where at least of these benders comprise at least one segmented bender, preferably at least one segmented disk bender.

In another embodiment of the invention, the actuation applied to the at least two interferometer actuators differs in time. The result of such different actuation is preferably a substantial improvement in the parallel movement of movable means. The difference in actuation in time can be determined by monitoring an interference signal. Alternatively the difference in actuation in time is a predetermined property or is determined by analysis of at least one previously measured interferogram.

In yet another embodiment, the present invention comprises features for the production of a segmented bender.

In many preferred embodiments of the present invention the movable means of the interferometer is a mirror. Such mirror is typically a planar but several equally preferred embodiments include other types of mirror, such as a corner cube mirror. Also many preferred embodiments include beamsplitter as movable means. The movement of the beamsplitter can offer increase of the obtained optical path difference (OPD), since the moving of the beamsplitter affects the pathlength of both arms simultaneously. Further in arrangement, such as a Fabry Perot interferometer, the movable means are semi-transparent minors, causing interference dependent on the relative position of the semi-transparent minors.

Embodiments of the present invention facilitate movement of movable means of an interferometer at different velocity or cycle time, such movement being brought about by interferometer actuator(s). Several embodiments facilitate scan speed of more than 1 cycle per second, such as 2 or more, preferably 5 or more, preferably 15 or more, preferably 50 or more, preferably 200 or more, preferably 1,000 or more cycles per second. Similarly embodiments of the present invention facilitate movement of movable means of the interferometer of velocity of 0.1 mm per second or more, such as 0.5 mm/s or more, preferably 1.0 mm/s or more, preferably 2 mm/s or more, preferably 5 mm/s or more, preferably 10 mm/s or more, preferably 50 mm/s or more, preferably 100 mm/s or more, such as 200 mm/s or more. Many preferred embodiments facilitate movement of movable means at substantially constant velocity, characterised by less than 1% difference in velocity over 90% of the movement or more, preferably less than 0.2% difference in velocity. Other equally preferred embodiments facilitate movement of movable means at substantially variable velocity, characterised by 10% difference in velocity or more, such as 20% or more difference in velocity, preferably 40% difference or more, preferably 100% difference or more, preferably 200% difference in velocity or more, where difference in velocity is determined from the ratio of the substantially lowest velocity to the substantially highest velocity.

In an embodiment of the invention, the velocity of the movable means relative to the interferometer body is constant.

In a preferred embodiment, the movement of the movable means relative to the interferometer body is 10 μm or more, preferably 50 μm or more, more preferably 100 μm or more, even more preferably 200 μm or more, such as 400 μm or more, preferably even 600 μm or more.

In a preferred embodiment, the movement of the movable means relative to the interferometer body is at rate of 1 movement per second or more, preferably 2 movements per second or more, preferably 5 movements per second or more, preferably 15 movements per second or more, preferably 50 movements per second, preferably 200 movements per second or more, preferably 1,000 movements per second or more.

A preferred property of many embodiments of the present invention is a considerably high harmonic frequency of the interferometer actuator in movements relative to the interferometer body. The harmonic frequency is to a certain degree a measure of the maximum cycle rate of the actuator but also defines the lowest frequencies which affect the mechanical stability, for instance against vibrations. Several preferred embodiments have harmonic frequency of the actuator which is at 100 Hz or higher, such as 200 Hz or higher, preferably 400 Hz or higher, preferably 1,000 Hz or higher, preferably 2,000 Hz or higher, preferably 4,000 Hz or higher.

Several preferred embodiments of the present invention assure movement of movable means of an interferometer in a parallel fashion, preferably to an extent that satisfies the requirements to parallel movement. Other equally preferred embodiments assure the parallel movement by actively controlling two or more individual benders or bender elements, typically in embodiments where requirements to parallel movement is higher than the inherent parallel behaviour of normally operated benders, or in embodiments where long-time performance can be expected to show deviation from initial performance. The active control of the two or more, preferably three, individual benders or bender elements is performed by determining individual control signals for each bender or bender elements, which substantially cause the interferometer actuator to perform substantially parallel movement. The determination of such individual control signals can be based on information gathered through previous activations of the actuator or on the bases of information gathered during the activation of the actuator, in some preferred embodiments the determinations is based on both previously and presently gathered information. In embodiments where the activation of the actuator is brought about by varying voltage, the individual control signals are applied as different voltage to the two or more individual benders or bender elements. Typically the requirements to tilting of movable means during movement, expressed as milliradians of maximum deviation from parallel movement is less than 4 mradians, preferably less than 2 mradians, more preferably less than 1 mradians, more preferably less than 0.5 mradians, more preferably less than 0.1 mradians.

Typically the physical size of a bender is small in the direction of the stroke, e.g. compared to a direction substantially perpendicular to the direction of the stroke. Several embodiments of the present invention include benders, bender arrangements or benders in series, where movable means are attached to both sides of the actuator, e.i. dual movable means, preferably where movable means are moved simultaneously and in parallel. Such movable means are preferably minors.

In several preferred embodiments of the present invention, that include dual movable means one of the movable means, e.g. a minor, is used in connection with the modulation of light intended for position or movement determination of the interferometer. Such light is typically substantially monochrome light, which when modulated renders a substantially simple interferogram, which is used in the determination of the position of the movable means. Using one side of dual movable means for this allows typically substantial simplification of the optical system, both the part modulating sampled light as well as the part modulating light for position determination.

In other equally preferred embodiments the dual movable means interact with the sampled light. Often such embodiments include increased OPD, for instance by affecting the pathlength of the two arms of a Michelson interferometer in simultaneously but in opposite manner.

Still other embodiments of the present invention use the dual movable means as a part of two separate interferometers. These embodiments include interferometers set up to measure light from the same source of light, either in a continuous manner by measuring a defined fraction, or in a manner where light is directed to each the interferometers in turn. The advantage of such system is the ability to measure both a sample and sample blind substantially simultaneously. This can offer several advantages as has been demonstrated in the field of spectroscopy. Further other of these embodiments include interferometers set up to measure light of different optical property, such as wavelength, orientation (e.g. polarisation) or phase. Typically the light from both interferometers interacts with substantially the same, or preferably similar sample, as this allows the determination of wider range of optical properties of a sample simultaneously.

Although size of an interferometer actuator is not always critical, it is often preferred in several embodiments of the present invention, that the interferometer is small in size, while other embodiments require strong mechanical stability. Size of the interferometer actuator in the direction parallel to the movement the movable means, e.i. thickness, is often of interest, for instance when considering piezoelectric bender or disk benders, where small thickness can give greater stroke length. Therefore several preferred embodiments include actuators of thickness 4 mm or less, preferably 2 mm or less, preferably 1.5 mm or less, more preferably 1 mm or less. In other words, the size of the at least one interferometer actuator in the direction substantially parallel to stroke length is 4 mm or less, preferably 2 mm or less, preferably 1.5 mm or less, more preferably 1 mm or less. In other equally preferred embodiments it is of interest to have the thickness of the interferometer actuator considerable, for instance when thickness gives piezoelectric bender or disk bender greater mechanical stability. In such embodiments thickness of 1 mm or more, preferable 2 mm or more, preferably 3 mm or more, preferably 4 mm or more.

In several embodiments it is preferred that the thickness of the interferometer actuator is in the range from 0.5 to 4 mm, preferably in the range 0.5 to 3 mm, preferably in the range 0.75 to 2 mm, preferably in the range 0.75 to 1.5 mm.

Similarly, the size of the actuator in the direction perpendicular to the direction of stroke, e.g. the primary direction of movement of the movable means, is of interest, for instance when this size substantially defines the stroke length of the actuator, such as a length of piezoelectric bender or diameter of a piezoelectric disk bender. Therefore several methods of the present invention prefer interferometer actuators which have certain size, such as 30 mm or more, such s 40 mm, 60 mm, 80 mm or even more than 100 mm.

In other preferred embodiments of the present invention, for instance where the size of the interferometer is of interest, or when for instance the mechanical stability of the interferometer actuator is improved, it is preferred to have the longest dimension of the interferometer actuator, e.g. length, typically the direction perpendicular to the movement of the movable means, is moderate of small. In such embodiment it is preferred that the length of the interferometer actuator is 100 mm or less, preferably 80 mm or less, preferably 60 mm or less, preferably 40 mm or less, preferably 30 mm or less. In certain embodiments, for instance when the size of the interferometer is small it is preferred to have interferometer actuators of length less than 30 mm, such as 20 mm or less, even 10 mm or less.

A method according to any of the preceding claims, where the size of the interferometer actuator in the direction substantially perpendicular to reflected light is in the range 100 mm to 20 mm, preferably in the range 80 mm to 30 mm, preferably in the range 60 mm to 40 mm.

In may preferred embodiments thickness compared to the movement of the movable means, is preferably 1% or more of the linear translation of the movable means, preferably more than 2% of the linear translation of the movable means, more preferably more than 5% of the linear translation of the movable means.

Generally, when considering piezoelectric benders, the combination of length and thickness determine mechanical stability and stroke length of the movable means of an interferometer. Several combinations of the above are therefore preferred, for the purpose of obtaining a preferred combination which typically can vary according to application.

Similarly the weight of the interferometer actuator is of interest in several preferred embodiments of the present invention. Typically small weights place less demands on the mechanical strength of the piezoelectric benders or bender arrangements, allowing improved performance of operation, typically scan speed and stability of movement. Therefore in these preferred embodiments the weight of the interferometer actuator, e.i. piezoelectric bender or bender arrangements, is less than 40 grams, preferably less than 20 grams, preferably less than 10 grams, more preferably less than 5 grams.

One preferred property of the interferometer actuator according to the present invention is the stability of movement of the movable means, such as stability in position and tilt stability. Position stability is measured in units of the wavelength of the light being analysed, and many preferred embodiments of the present invention make it possible to have position stability which is better than 10% of the wavelength of the light being analysed or better, such as 5% or better, preferably 2% or better such as 1%. Further other embodiments, offer even better position stability, preferably better than 1% such as 0.5% or better, preferably 0.1% or better. Tilt stability is the tilting of the movable means during the movement of the movable means, a property which, for instance has influence on the effectiveness of modulation in Michelson interferometer. Tilt stability is measured in either a fraction of the wavelength of light being analysed of the width of the optical beam traversing the interferometer, and several preferred embodiments of the present invention realise tilt stability of 1 wavelength across the width of optical beam or better, such as ½ wavelength or better, such as ¼ wavelength or better, such as ⅛ wavelength or better. Many preferred embodiments of the present invention comprise methods of determining methods of movement based on the analysis of data obtained in the past, to be used in methods of movement in the future. Many of the preferred embodiments of the present invention are characterised by being able to maintain such stability of movement without any real-time information, intended as feedback with which predetermined method of movement is altered, although several embodiments use such real-time feedback, preferably for the purpose of improving and/or monitor movement stability. In many preferred embodiments such stability of movement is maintained for the duration of 2 or more analysis with the interferometer, such as 4 or more analysis, or 16 or more analysis, such as 128 or more analysis, such as 512 analyses.

The preferred stroke length of interferometer actuator is determined by the application at hand, such as wavelength of light, chemical and/or physical property under consideration and the spectroscopic method. In some embodiments of the present invention stroke length of interferometer actuator is in the range from 0.5 mm to 5 mm, typically preferred in methods including light of high frequency such as 5,000 to 100,000 $cm^{-1}$ based on high-resolution spectroscopy, or frequencies such as 1,000 to 10,000 $cm^{-1}$ based on mid-resolution spectroscopy or frequencies less than 1,000 $cm^{-1}$ based on low-resolution spectroscopy. In other embodiments stroke length in the range 0.1 mm to 1 mm is preferred, typically preferred in method including light of frequency such as 2,000 to 100,000 cm$^{-1}$ based on mid-resolution spectroscopy or frequencies less than 5,000 cm$^{-1}$ based on low-resolution spectroscopy. In yet other embodiments stroke length of 50 µm to 500 µm is preferred, typically preferred in method including light of frequency such as 3,000 to 100,000 cm$^{-1}$ based on mid-resolution spectroscopy such as less than 4,000 cm$^{-1}$ based on low-resolution spectroscopy. In percent context the type of resolution spectroscopy is a general term relating to the resolution of typical spectral features such as observed in liquid samples, other samples or spectral property would result in a different classification.

Different embodiments of the present invention are preferred for the implementation of various spectroscopic analysis, typically transmission, emission or absorptions spectroscopy. An example of preferred spectroscopic methods, in which embodiments of the present invention are applicable are far-IR, mid-IR, near-IR, visible and UV measurements of liquid, solid and gas sample, such as transmission, reflectance, emittance, attenuated total reflectance, diffuse reflectance, photoacoustic, fluorescence, phosphroescence, chemiluminescence, Raman.

It is the property of several preferred embodiments of the present invention that position and/or tilting of the movable means can be controlled by applying a predetermined pattern of movement to at least two individual interferometer actuators. Preferably the position and/or the tilting, at a predetermined actuation, of the movable means vary less than a predetermined relative amount from a first stroke of the actuator to a second stroke of the actuator, such relative amount being less than 1%, such as 0.1% or less, preferably 0.01% or less, preferably 0.001% or less. When considering position, such variation of position is preferably less than 100 nm, such as 50 nm or less, preferably 20 nm or less, preferably 10 nm or less, preferably 5 nm or less, preferably 1 nm or less. When considering tilting, such variation of tilt is preferably less than 100 µrad, such as 50 µrad or less, preferably 20 µrad or less, preferably 10 µrad or less, preferably 5 µrad or less, preferably 1 µrad or less. The time elapsing between a first and a second stroke of the actuator being of the order of one time of stroke or more, such as 4 stroke times or more, preferably 10 stroke times or more, preferably 100 stroke times or more, preferably 1,000 stroke times or more. In embodiments the time elapsing between first and second stroke are of the order of 1 minute or more, such as 4 minutes or more, preferably 10 minutes or more, preferably 1,000 minutes or more. In other embodiments the time elapsing between first and second stroke are of the order of 1 day or more, such as 4 days or more, preferably 10 days or more, preferably 1,000 days or more.

In several embodiments of the present invention, the movable means are in motion while the modulation by the interferometer is determined through measurement of the interference signal, e.g. scanning interferometer. In other equally preferred embodiments the movable means are at substantial stand-still during the determination of at least a part of the interferogram, through measurement of the interference signal. e.g. step-scan interferometer.

Several embodiments of the present invention are preferred for the implementation of image analysis, preferably image analysis including spectral separation, such as colour imaging, including applications such as UV, Vis, near-IR, mid-IR, fluorescence, Raman image spectroscopy.

In a preferred embodiment, the system according to the invention comprises at least two interferometer actuators that can be operated substantially individually. These two interferometer actuators may comprise at least one piezoelectric actuator, preferably at least one piezoelectric bender, preferably dual-layer bender or the two interferometer actuators may comprise at least one linear actuator, preferably at least one linear piezoelectric actuator, preferably at least one piezoelectric bender.

In a preferred embodiment of the system according to the invention, the movement of the at least one movable means of an interferometer is provided by at least two piezoelectric benders in a bender arrangement, where the at least two piezoelectric benders in the bender arrangement are operated in substantially same manner.

Preferably, the system according to the invention comprises means for moving the at least one movable means in a manner so that the length of the movement of the at least one movable means of the interferometer relative to the body of the interferometer is substantially equal to the stroke length of the at least one piezoelectric bender in the bender arrangement.

In a preferred embodiment, the interferometer actuator according to the invention comprises at least two piezoelectric bender elements that are arranged on the same bender support to form a segmented bender, preferably where the individual bender elements can be activated independently.

In preferred embodiments, the method and system according to the invention comprises three interferometer actuators that can be operated substantially individually.

The present invention may also relate to a method and a system for the movement of a movable means of an interferometer, comprising one or more interferometer actuator(s), preferably interferometer actuator(s), by
attaching a first point of each of said interferometer actuators in firm arrangement with said interferometer body,
attaching a second point of each of said interferometer actuators in firm arrangement with said movable means, said second point moving relative to said first point upon activation of said one or more interferometer actuator(s),
activating said interferometer actuator(s) by applying electrical field causing it/them to bend, said bending causing said movable means to move relative to said interferometer body.

EXAMPLE 1

Arrangement of Two Actuators

Due to the nature of actuators, actuators can cause tilting of movable means attached to such actuator. In particular, for simple piezoelectric benders, the moving points tilts relative to the fixed point as it moves, e.g. angular stroke, it is typically preferred to use two benders in a bender arrangement. This substantially compensates for the tilting between the fixed and moving point, for instance by connecting the two moving points with a fixture which substantially does not bend.

Such arrangement of two actuators is illustrated in FIG. 1, in a schematic manner (note that the number elements of the figure refer to all element of similar appearance, although only one of these elements is referenced for clarity). The figure shows three possible embodiments of two individual actuators, one comprising actuators generating substantially linear stroke and two embodiments comprising benders generating substantially angular stroke, while of course other embodiments are equally possible and where typically the preferred embodiment is determined by construction properties, such as size and tilting requirements, among others. Individual actuators are typically characterised by the possibility of individual or substantially individual actuation of each actuator.

FIG. 1A shows two linear actuators (101), in an arrangement where the stroke is substantially in the plane of the drawing. The actuators are attached to the interferometer at the fixed point(s) (102) and the powing points of the actuators (103) are attached to the movable means, typically comprising a fixture (104) and an optical component, such as a minor (105).

In FIG. 1B two benders (111), arranged in a linear manner with opposite orientation, comprising a support and active piezoelectric material (form shape and size of the active material is determined by mechanical requirement), which are attached to the interferometer at the fixed point (112) and to the fixture of the movable means at the moving point (113). The movable means typically comprises a fixture (114) onto which the optical means, e.g a minor, are attached (115), the movement of the movable means in FIGS. 1B and 1C being substantially perpendicular to the plan of the drawing. In FIG. 1C the benders are arranged in such a way that they are not in a linear arrangement, but the fixed point of one bender is located close to the moving point of the other bender.

Relative to FIG. 1B, FIG. 1C shows a design that is considerably shorter in the horizontal direction, while it is slightly longer in the vertical direction. The overall size of the arrangement in FIG. 1B is linear, while the arrangement in FIG. 1C is a closer representation of a square. As such the two designs are suitable for embodiments where such general size features are suitable.

Another difference in the two designs in FIGS. 1B and 1C is illustrated by the length of the fixture of the movable means. In FIG. 1C its length is approximately twice the length in FIG. 1B. In the case, where both benders operate in identical manner, this does not have any significant effect, but if there is a substantial difference in the stroke length of the two benders then the tilting of the movable means would be expected to be less in the construction illustrated in FIG. 1C, as the same difference in stroke length of the ends of the fixture, causes less angular tilting. In addition to this, several embodiments of the present invention drive the two benders substantially individually, thus allowing at least partial compensation for difference in stroke length of the two piezoelectric benders.

This example illustrates that different properties can be obtained by arranging two actuators and indeed these, as well as many other arrangements are a feature of preferred embodiments of the present invention.

EXAMPLE 2

Arrangement of Three Actuators

Figure 2:
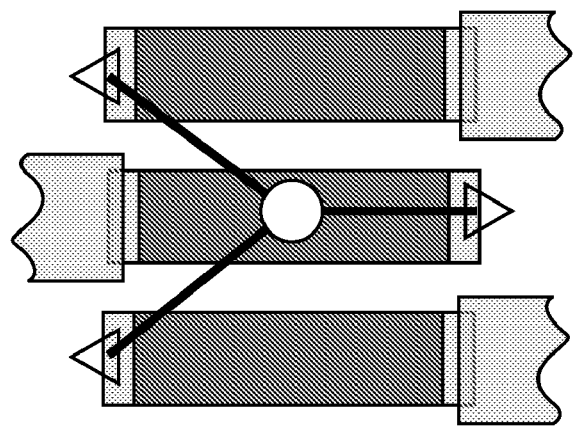
FIG. 2 illustrates arrangement of three interferometer actuators.
Figure 2:
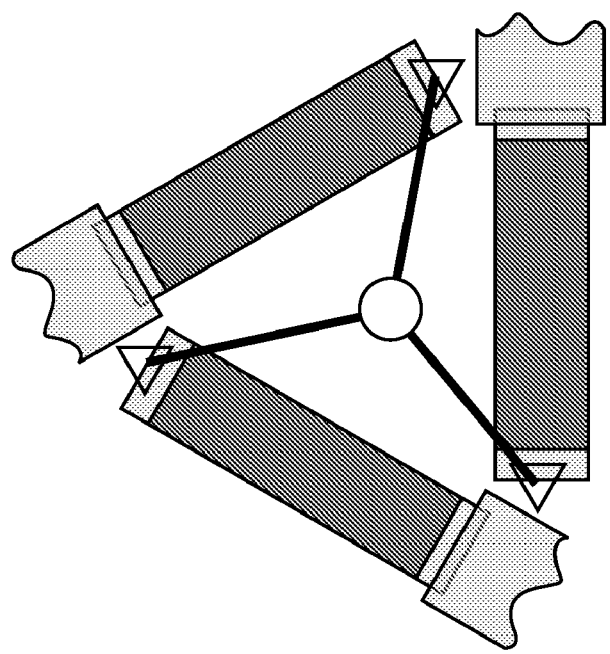

Several actuator arrangements according to the present invention allow for substantial elimination of angular tilt of the movable means. The correction of tilting in a plane generally needs three point attachment, since for instance in a two point attachment it is possible that the movable means tilts around the line between the two points. FIG. 2 illustrates two arrangements of 3 piezoelectric benders which allow full tilting control of movable means of an interferometer while allowing the minor to be moved back and forth. For explanation of the different elements of the illustration, refer to explanation to FIG. 1.

FIG. 2A illustrates 3 piezoelectric benders in parallel arrangement. Such arrangement represents features, preferred in several embodiments of the present invention, such as rectangular design. The rectangular design is often preferred as it simplifies production of mechanical parts and fits to an otherwise rectangular design. Also it is possible to implement design that is not square, e.g. by including benders, which are considerably longer than they are wide to increase stroke length of a given bender arrangement.

The design presented in FIG. 2A has two potential drawbacks, which the design in FIG. 2B offers a solution to. Firstly the angles between the three moving points are not always identical, e.g. in a design that is not substantially square, and secondly the bending force, caused by the angular tilt between the fixed and moving point of the bender is not always symmetric in the bender arrangement, such bending force being substantially double in the side where the moving point of two benders are compared to the other side where only one moving point is located.

An arrangement of three piezoelectric benders which substantially eliminates this is presented in FIG. 2B. In this arrangement the 3 benders are arranged with equal angle between them forming a triangle with equal sides (e.g. rotational symmetry). If the movable mean are placed at the centre of such bender arrangement then the angle and force at the movable points is equal in all cases.

In addition to this, several embodiments of the present invention drive the three benders substantially individually, thus allowing at least partial compensation for difference in stroke length of the three piezoelectric benders.

From the present example it becomes obvious to a person skilled in the art, that an arrangement of three linear actuators, can be arranged in a manner similar to that of the benders discussed above, of course with the obvious difference that since the stroke of such actuators is substantially linear, such actors would be placed in a manner which would substantially produce movement of the movable means perpendicular to the plan of the drawing. Indeed many arrangement of linear actuators are preferred in several embodiments of the present invention.

This example illustrates that different properties can be obtained by arranging three piezoelectric benders and indeed these as well as many other arrangements are a feature of preferred embodiments of the present invention.

EXAMPLE 3

Disk Bender

Figure 3:
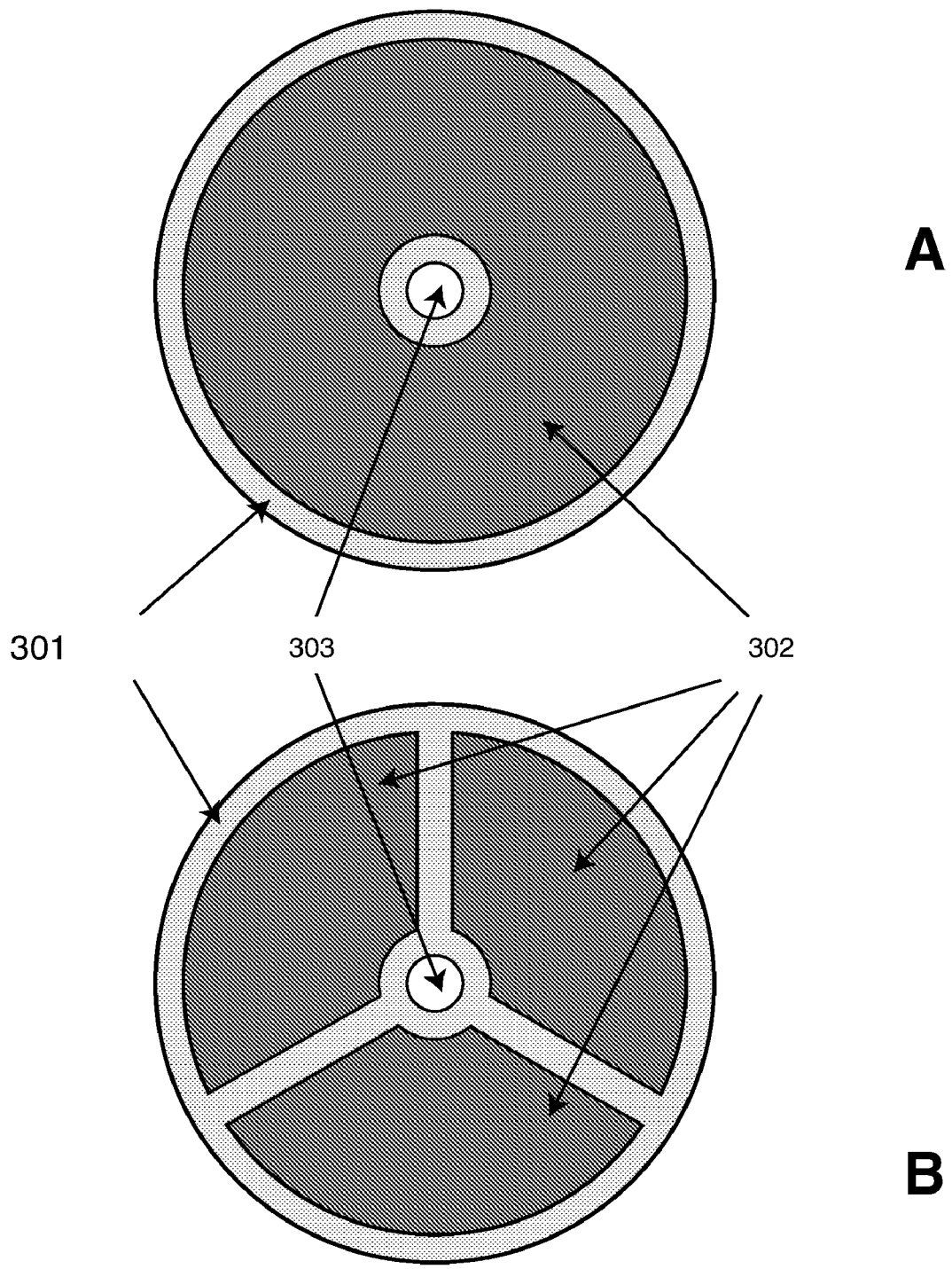
FIG. 3 illustrates piezoelectric disk bender and segmented piezoelectric bender.
Figure 3:
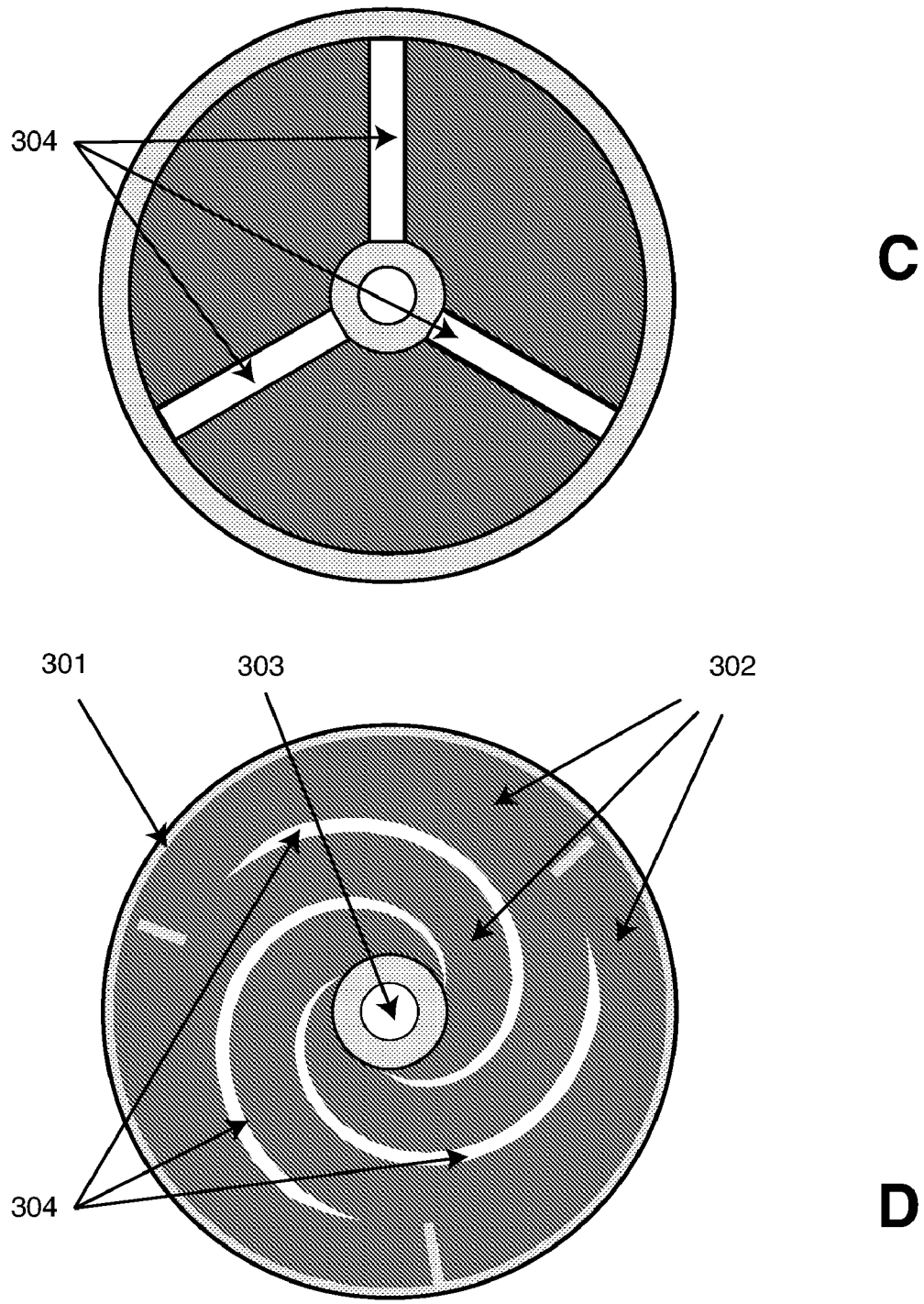

A bender design often preferred in the present invention is a disk bender. The disk bender has several advantages, favourable for interferometry, but mainly its mechanical strength and stability are of interest. Four possible designs of disk benders are presented in FIG. 3. A piezoelectric bender disk comprises a support material (301) onto which a layer of piezoelectric material (302) is deposited. The outer rim of the support material forms the fixed point of the bender and the rim of the disk is typically securely fixed to the interferometer body, while the centre of the disk (303) is the moving point of the bender, onto which the movable means are attached. Typically piezoelectric material is deposited on both sides of the actuator, while only deposition on one side of the disk is shown for clarity. As this is the typical arrangement of a disk bender, there are preferred embodiments of the present invention, where the interferometer body and the movable means are attached in opposite manner, but for the sake of clarity the former method of attachment will only be considered.

FIG. 3A shows a disk bender, where the piezoelectric material is distributed evenly on the disk. In this configuration the centre of the disk moves in and out of the plane of the disk, causing the attached movable means to move. This configuration offer good mechanical properties, mainly with respect to resistance to forces represented in the plane of the disk, but also to forces perpendicular to the plane of the disk, e.g. in the direction of the stroke of the bender.

On the other hand, mechanical imperfection in the making or mounting of the disk and/or wear of prolonged operation can cause the surface of the disk to display varying bending properties. Such defects can potentially cause angular tilting of any movable means attached to the moving point of the disk bender. Therefore FIG. 3B presents an arrangement of piezoelectric bender segments on a single bender support material, e.g. a segmented bender, preferred in many embodiments of the present invention. In FIG. 3B a segmented bender comprising three bender segments is presented, where the bender segments are evenly distributed along the surface of the disk. Optionally and typically bender segments are present on the opposite side of the disk in substantially identical configuration.

One implementation of a segmented bender, similar to the one illustrated in FIG. 3B is shown in FIG. 3C, with the additional feature that the bender support is also segmented (304). This segmentation of the bender support can give increased stroke length of the bender, while it will compromise the mechanical strength of the bender.

The previous implementations have all been in radial orientation of the bender element. Other embodiments deviate from this, in particular when it is of importance to obtain increased stroke length of the bender. One such design is illustrated in FIG. 3D, a design where the bender elements are aligned in a spiral manner, rather than in a radial manner. This increases the effective length of the bender, and thus potentially its stroke length, obviously reducing the mechanical strength of the segmented bender.

Preferably the three or more bender segments can be operated substantially individually, e.g. by applying electrical force of different amplitude. In this manner it is possible to operate the segmented bender disk in such a way that angular tilting of the movable means can be compensated for, thus compensating for bending properties of the different bender segments.

This example illustrates that different properties can be obtained by using piezoelectric disk bender or segmented bender and indeed these as well as many other related configurations are a feature of preferred embodiments of the present invention.

EXAMPLE 4

Benders in Series

Since piezoelectric benders are typically considerably smaller in thickness, compared to length, as well as being relatively light in weight, several preferred embodiments of the present invention include two or more benders arranged in series, such that the movement of the movable means of the interferometer is substantially the combined stroke length of the individual benders in series.

Figure 4:
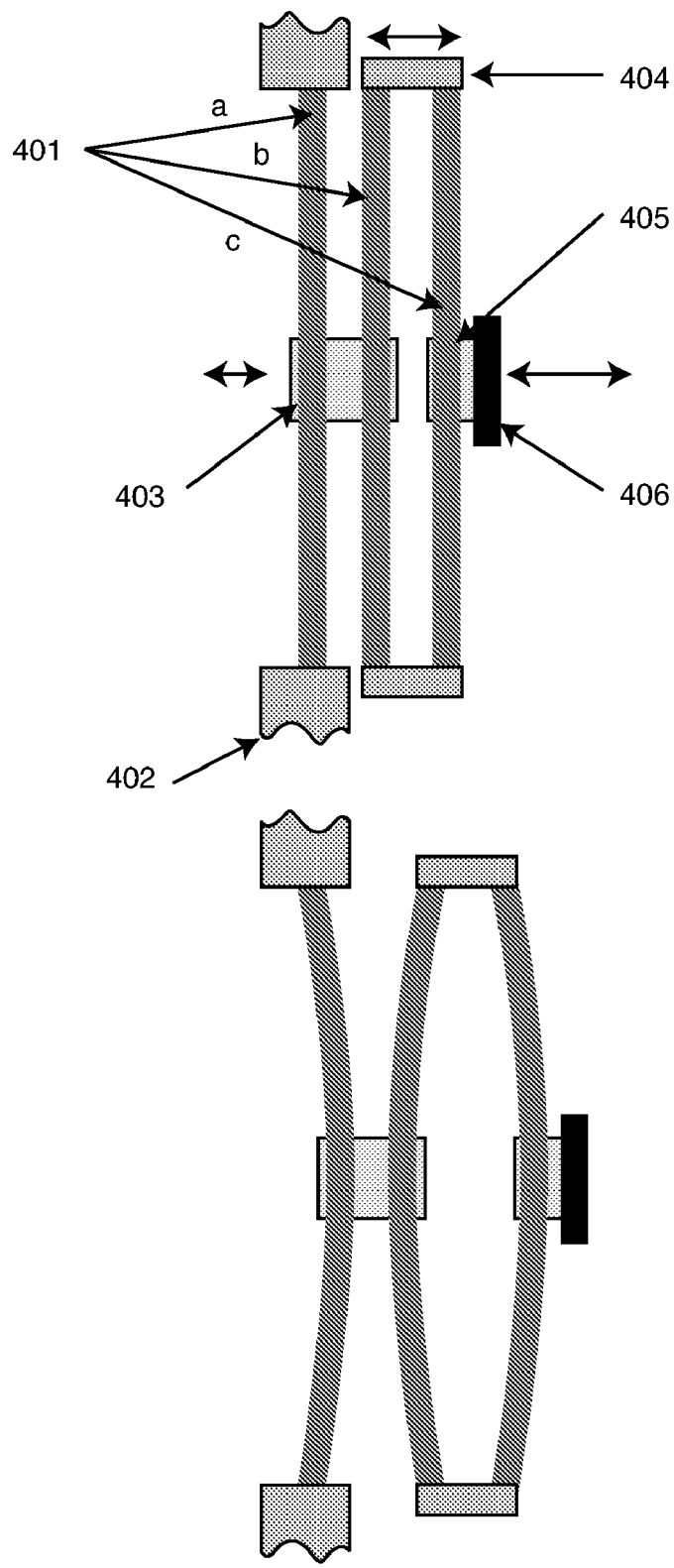
FIG. 4 illustrates piezoelectric benders arranged in series to produce combined movement.

FIG. 4 illustrates three benders or bender arrangements (401), which are arranged in series. The fixed point of the first bender (401a) attached to the interferometer body (402) but its moving point is attached to means (403) which further is attached to the moving point of the second bender (401b), thus causing the moving point of the first and the second benders to move together. The fixed points of the second and the third bender (401c) are joined together and thus fixed relative to each other by attachment means (404). Finally the movable means of the interferometer (406) is attached to the moving point of the third bender by attachment means (405). FIG. 4A is an illustrator of the benders in series in passive position.

The movement of the movable means is illustrated in FIG. 4B. It illustrates a movement in one direction, but as the figure is schematic and for illustration purposes only, it is obvious that it is possible to make a design where movement in the other direction is equally possible. The movement is brought about by firstly the movement of the moving point of the first bender, which causes the movement of both the second and third bender in the same direction. Secondly, as the fixed points of the second and third benders do not move relative to each other, the third bender is moved further by the movement of the second bender. Thirdly the movable means are moved relative to the fixed point of the third bender, thus causing movement of the movable means relative to the interferometer body that is the combined movement of all of the benders.

From the above it is obvious that, by using similar methods of arrangement, it is possible to combine different number of piezoelectric benders in series. The benders suitable for use in such a serial arrangement can be of different types and properties, as demanded by the application at hand, such as requirement to the length of movement of the movable means and the mechanical stability of the design.

As the combination of different properties of the movement of the benders arranged in series will be reflected in the movement of the movable means, beside stroke length, effects such as increased angular tilting of the movable means during movement can be expected. Different embodiments of the present invention implement various methods for the reduction or elimination of undesirable effects, e.g. tilting, for instance by pairing benders with known properties in a manner that substantially cancels such effect and/or by including one or more bender arrangement or segmented bender, which allows active compensation of tilt, e.g. by the application of individual electrical force to individual benders or bender segments.

This example illustrates that increased length of movement of movable means of an interferometer can be obtained by using piezoelectric disk bender or segmented bender in series and indeed these as well as many other related configurations are a feature of preferred embodiments of the present invention.

EXAMPLE 5

Parallel Benders

Piezoelectric benders are typically of a form, where the size in a direction perpendicular to the direction of stroke is considerably larger than the size in the direction of the stroke. This property is generally not an ideal construction, for instance when considering mechanical stability against force causing rotation of any mechanical attachment such as movable mirror to the centre of a circular disk bender. In order to improve mechanical stability against rotation of the movable means, and also substantially reduce tilting caused by imperfect response of piezoelectric material and/or mounting of piezoelectric bender several preferred embodiments of the present invention include two or more piezoelectric benders is parallel.

Figure 5:
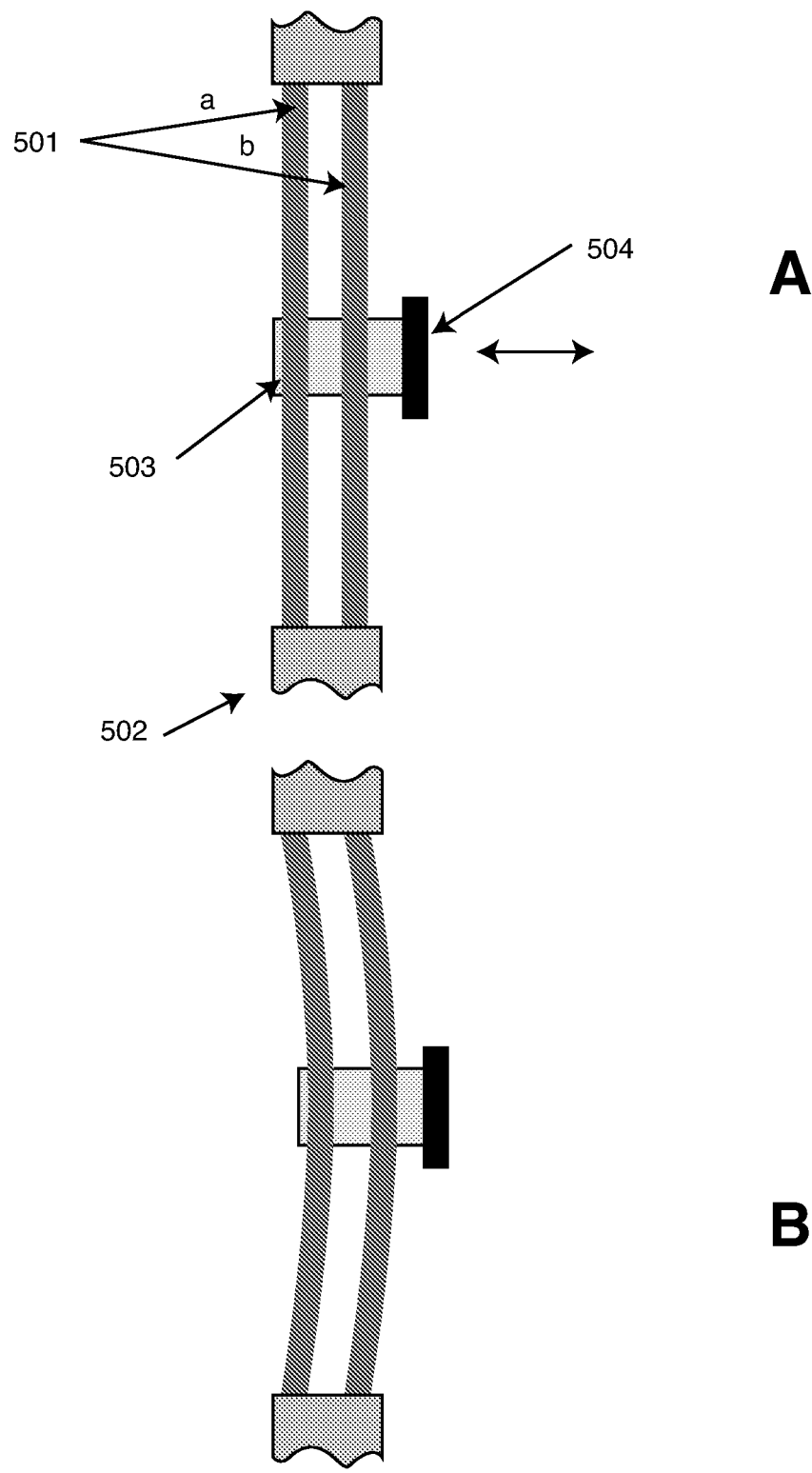
FIG. 5 illustrates piezoelectric benders arranged in parallel to produce stable translation.

FIG. 5 shows two disk benders (501a and 501b) in parallel arrangement, where the fixed point of the benders is attached to the interferometer house (502), and the moving points of both benders is attached to the moving means (503), onto which a minor (504) is attached. FIG. 5A shows the benders in relaxed position, while FIG. 5B shows the benders in a position where force applied to both benders causes them to bend in the same direction, thus moving the movable means and, for instance a mirror, in the stroke direction. As the movable means are in contact with both piezoelectric benders it is obviously possible to increase the resistance to rotation, or tilt movement. Similarly the design can reduce tilting of the movable means, caused by lack of parallel movement in either of the benders, a property which can further be improved by selecting benders according to tilting properties, and/or activating the benders, or segments of the benders, in a manner which reduces or eliminates any tilt.

This example illustrates that increased mechanical stability of movable means of an interferometer can be obtained by using piezoelectric disk bender or segmented bender in parallel and indeed these as well as many other related configurations are a feature of preferred embodiments of the present invention.

EXAMPLE 6

Tilting Compensation

Figure 6:
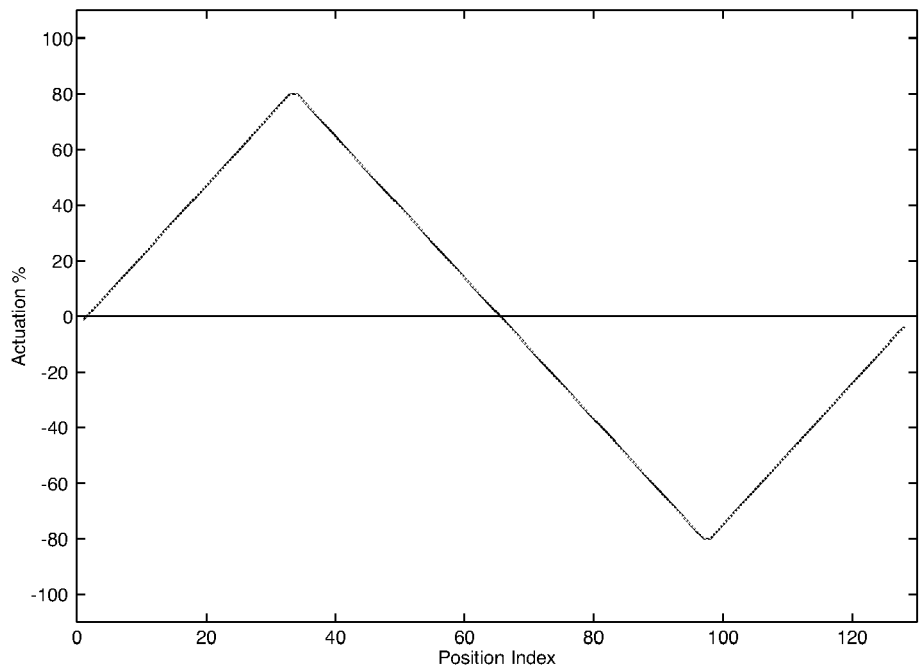
FIG. 6 Illustration of the effect of controlling individual interferometer actuators for the purpose of tilt control.
Figure 6:
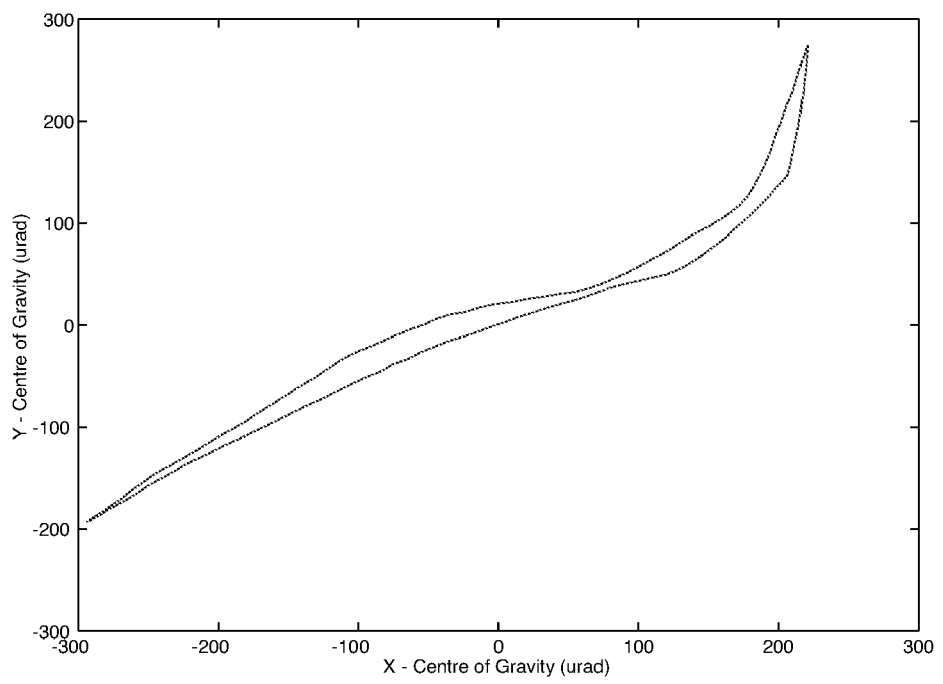
Figure 6:
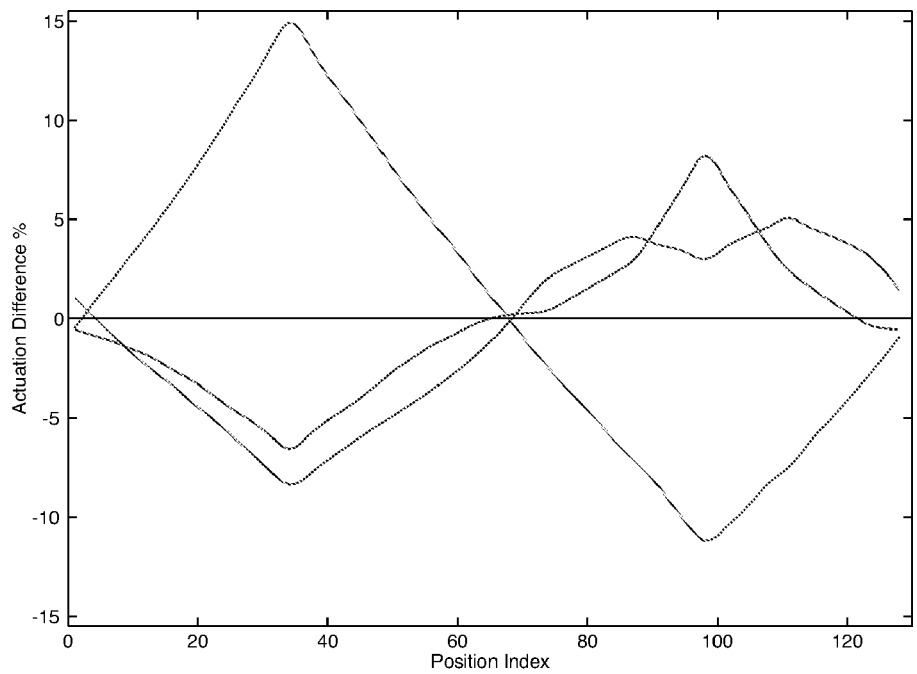
Figure 6:
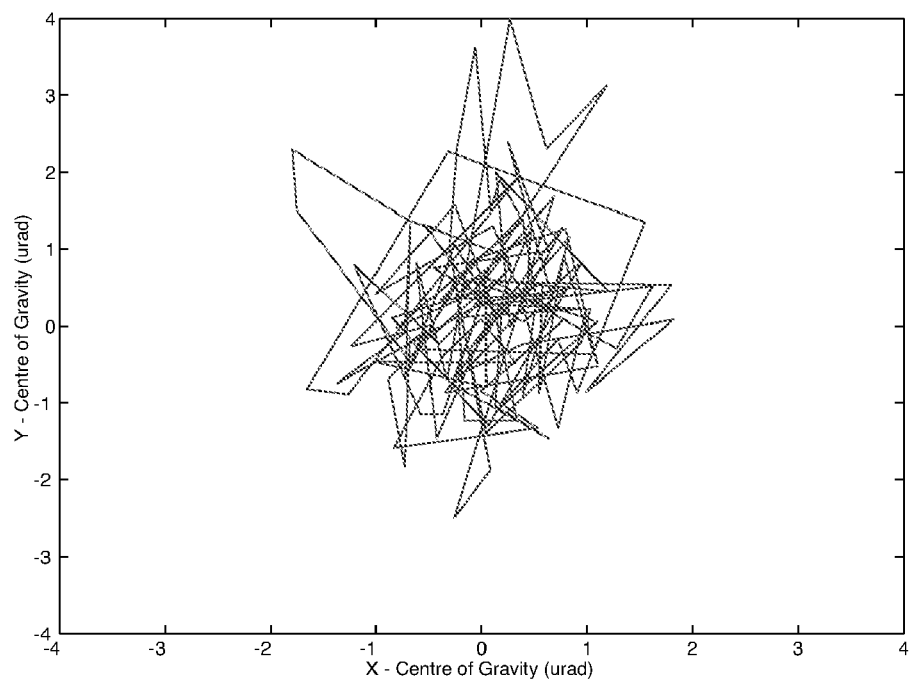

An embodiment of the present invention, comprising a segmented piezoelectric disk bender, as illustrated in FIG. 3B, was used to demonstrate the possibility of producing translation while controlling the tilting of the movable means. The disk bender was a 40 mm disk, comprising support material of about 1 mm in thickness, with piezoelectric material on both sides, each covering about 120° of the disk separated by a 1 mm gap. The maximum stroke length of the disk was approximately +/−100 μm Initially the bender was operated by applying about +/−80% voltage across all segments in identical manner, as illustrated in FIG. 6A, which shows actuation voltage changed in cyclic manner, in cycles of 128 steps. As this produced movement of movable means, comprising a substantially planar minor, the reflection of a laser beam of the mirror of the movable means was captured on an imaging device, a CCD camera at the 128 positions of the cycle, representing a back and forth movement of the movable means. From each of the captured images, the optical centre of gravity of the image was determined in units of the pixels of the CCD and these values were transformed to angular information. FIG. 6B shows a graph of the tilting at each of the 128 positions, in two perpendicular directions, X and Y. The graph illustrates that under the conditions tested, that the movable means tilt by about +/−250 μrad (micro radians) in both directions. Further the tilting shows a pattern, similar to a hockey stick, with a fairly straight change in tilt during one half of the movement in approximately the direction X=Y, while the tilting during the other half of the movement forms an approximate arc in the X-Y graph. This is presumably caused by the fact that the segmented bender comprises 6 individual piezoelectric elements, the elements on each side being substantially only active for 1 half of the stroke, and these show individual behaviour regardless of the arrangement.

Based on the observed tilting of the movable means, a method of activating the individual piezoelectric elements was determined. The method is based on iterative determination of tilt response of individual bender segments. Result of an iterative determination of segment actuation is given in FIG. 6C, which shows a graph of the absolute deviation from identical actuation, as shown in FIG. 6A, for each of the three individual segments. The goal of the iteration was to determine actuation, such that the average actuation at each point was identical to the initial identical actuation. The graph shows that one of the segments is activated in phase with the general actuation, with up to additional 15% actuation. The other segments are activated in substantially reversed phase.

A typical result of individual actuation of segments is given in FIG. 6D. The figure shows a graph, similar to that of FIG. 6B, with angular tilt in X and Y directions for each point in a 128 position stroke. Where FIG. 6B shows initial tilting of approximately +/−250 μrad, FIG. 6D shows tilting of approximately +/−2 μrad, or about 99% reduction of tilting. This variation in tilting demonstrated in FIG. 6D is similar to the random variations observed in the system used for the determination, e.g. noise, which indicates that even further control of tilting could be obtained if the tilt detection system were improved. Investigation of the system under investigation has shown that the system substantially maintains its tilting stability for a considerable time, such as minutes, hours, or even days.

The present example shows that it is feasible to substantially compensating tilting caused by an interferometer actuator comprising more than 2 individual actuators, such as 3 pairs of individual actuators, which show minute difference in actuation causing substantial tilting of movable means. This is done by activating the individual actuators in an individual predetermined manner. Further the present example shows that such tilt compensated actuation is stable for considerable time, making it feasible to use in an embodiment based on initial or periodic determination of tilting compensation. From the above it is clear to a person skilled in the art that the method of controlling tilting produced in a segmented piezoelectric disk bender is equally well suited for the controlling of other embodiments comprising individual interferometer actuators, such as benders or linear actuators.

EXAMPLE 7

Dual Mirrors

Several embodiments of the present invention, typically comprising piezoelectric benders as interferometer actuators, include two optical means, such as minors, attached to the same actuators.

Figure 7:
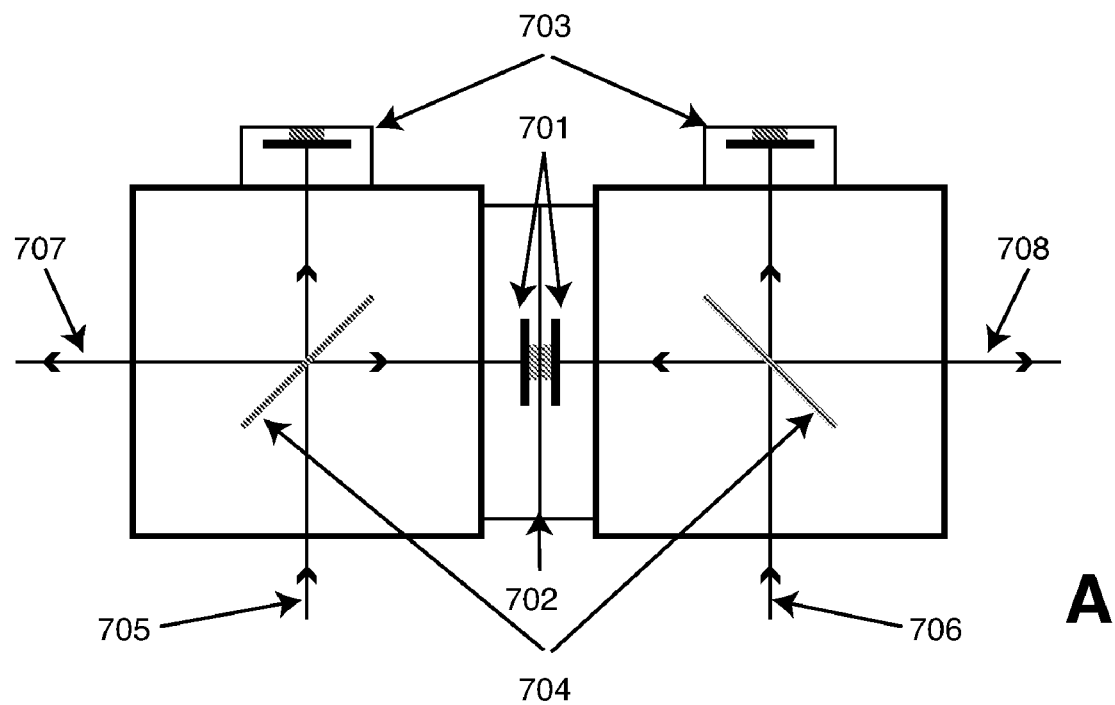
FIG. 7 illustrates Michelson interferometers based on dual mirrors.
Figure 7:
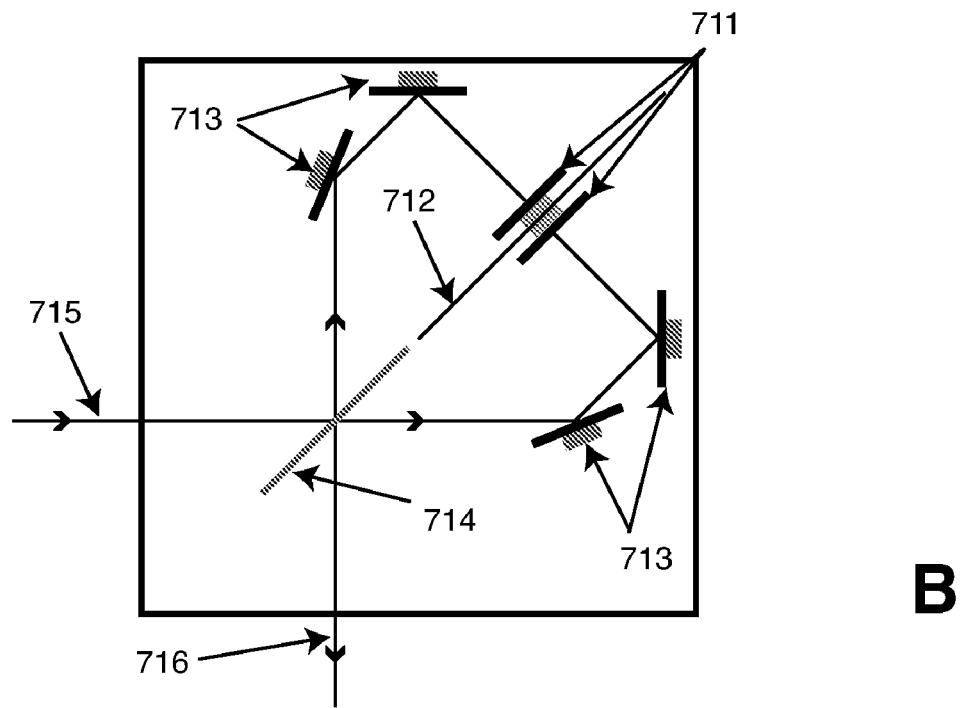

FIG. 7 shows an arrangement of two mirrors attached to a single piezoelectric bender. FIG. 7A shows an arrangement, where moving mirrors (701) are attached to a bender (702), such as a disk bender, which is arranged between two Michelson interferometers, each interferometer defined as optical elements on either side of the two moving mirrors, e.g. mirrors (703) and beamsplitters (704). The first interferometer contains entrance light (705) and exit light (707) and the second interferometer contains entrance light (706) and exit light (708).

The two Michelson interferometers illustrated in FIG. 7A can be operated in a number of configurations, defined by the nature of the application at hand. For the implementation of such application, optical components of appropriate type are used. The application could for instance be using one interferometer for the generation of interferogram, while using the other to determine position of the moving minor, e.g. by modulating a narrow light source, such as a laser, laser diode or LED, since both moving mirrors move in a synchronised manner.

Another application could be to modulate light of substantially different wavelength regions, such as mid-IR and near-IR. This allows simultaneous determination of interferogram of the two spectral regions.

Other application can be the measurement of two samples, or a single sample under different conditions, in particular, when a sample and sample blind are measured simultaneously.

FIG. 7B shows an alternative arrangement based on two minors attached to a single piezoelectric bender, implemented in a single Michelson interferometer. In this arrangement the two moving minors (711) are attached to piezoelectric bender (712). Further the interferometer contains stationary minors (713) and beamsplitter (714). The entrance light (715) is separated into the two arms of the interferometer, each arm terminated by a moving minor. As the moving minors move, the optical path difference of the interferometer is twice the movement of the mirrors, thus producing an interferogram upon combination of the light of the two arms, emitting modulated exit light (716).

The present example shows that it is possible to use an interferometer actuator to move a pair of movable means, e.g. mirrors, and thus obtaining advantages such as multiple use of mirror movement, or increase of effective optical path difference.

EXAMPLE 8

Moving Beamsplitter

The shape of piezoelectric benders, e.g. disk benders, where the thickness is considerably less than the length, is used in many preferred embodiment of the present invention. One such preferred embodiment comprises beamsplitter as movable means.

Figure 8:
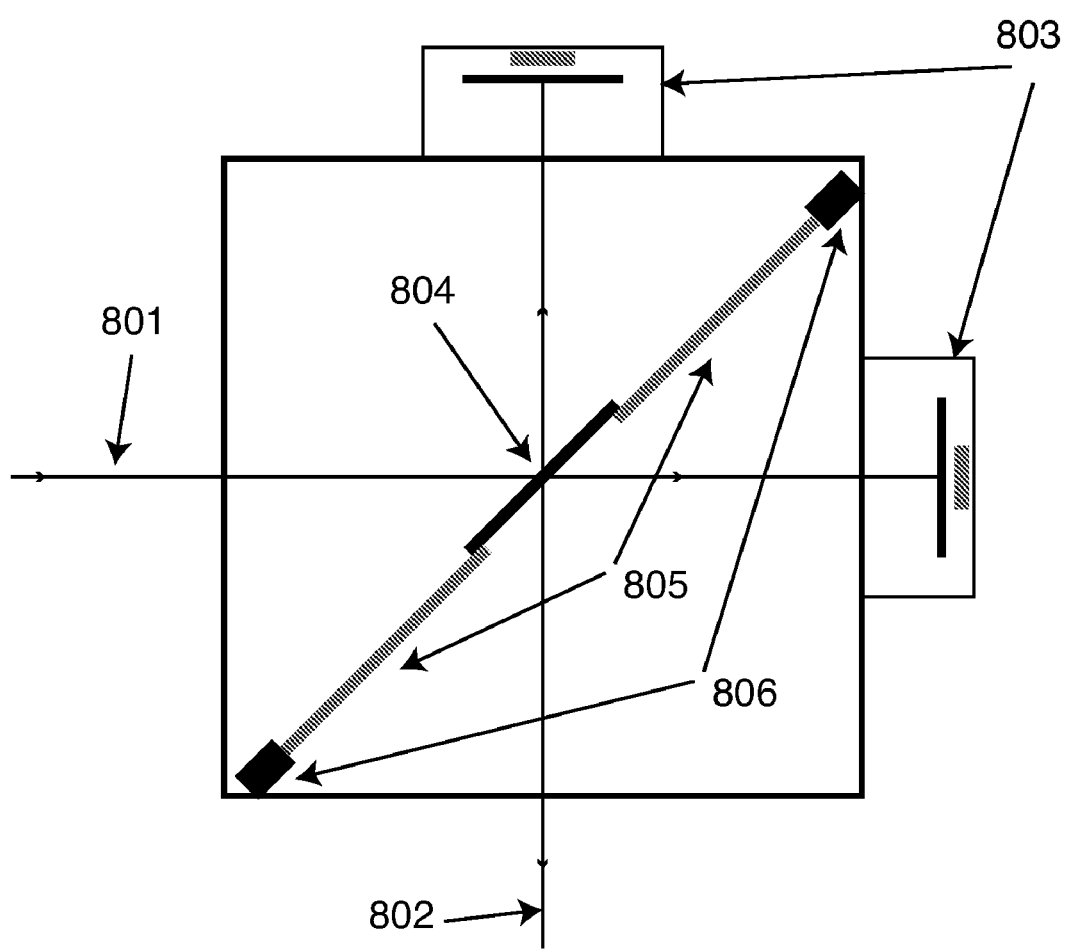
FIG. 8 illustrates Michelson interferometer based on moving beamsplitter.

FIG. 8 illustrates a Michelson interferometer, comprising a moving beamsplitter, in a view of a section through the centre of the interferometer along the optical axis. The entrance light to the beamsplitter (801) and the exit light (802) are modulated by passing the two arms of the interferometer, reflected from mirrors (803), under conditions where the beamsplitter (804) is moved, substantially in a direction of 45° to the main axis of the interferometer. The beamsplitter is attached to the bender (805), such as a piezoelectric bender or piezoelectric disk, where the stationary part of the bender is attached to the interferometer body through fixation point (806). When the bender is a piezoelectric disk bender, the beamsplitter is attached to the moving point of the bender, e.g. the inner rim of the disk, where the hole in the centre of the disk has dimensions which allows the light signal to pass.

The effect of moving the beamsplitter is that the optical paths of the two arms are changed in opposite direction, thus increasing the effective optical path difference of the interferometer.

The invention claimed is:

1. A method for the movement of at least one movable means of an interferometer relative to the body of the interferometer, comprising:
   arranging at least three interferometer piezoelectric actuators, wherein said at least three interferometer piezoelectric actuators are arranged to be operated individually, so that the at least three piezoelectric actuators are capable of moving the at least one movable means of the interferometer;
   activating at least one of the at least three interferometer piezoelectric actuators to operate in parallel, thereby moving the at least one movable means of the interferometer with a stroke length of at least 10 µm; and
   activating at least one other of the at least three interferometer piezoelectric actuators to control the tilt of the at least one movable means.

2. The method according to claim 1, wherein the at least three interferometer actuators which are arranged to be operated individually comprises:
   at least one bendable piezoelectric actuator; and/or
   at least one linear piezoelectric actuator.

3. The method according to claim 2, wherein:
   at least three benders are arranged in series; or
   at least three segmented benders are arranged in series.

4. The method according to claim 2, wherein:
   at least three benders are arranged in parallel, wherein the result of the arrangement is a substantial increase in mechanical stability of the movable means of the interferometer; and
   at least one of the at least three benders arranged in parallel comprises at least one segmented bender.

5. The method according to claim 1, wherein the at least three piezoelectric actuators are activated by applying an electrical field causing them to bend, said bending causing said at least one movable means to move relative to said interferometer body.

6. The method according to claim 1, wherein:
   the movement of the at least one movable means of an interferometer is provided by at least three piezoelectric benders in a bender arrangement, where the at least three piezoelectric benders in the bender arrangement are operated substantially in same manner; and
   the length of the movement of the at least one movable means of the interferometer relative to the body of the interferometer is substantially equal to the stroke length of the at least one piezoelectric bender in the bender arrangement.

7. The method according to claim 1, wherein:
   the at least three piezoelectric actuators are piezoelectric benders which are substantially identical in design and construction;
   any piezoelectric bender is arranged at an angle to any other piezoelectric bender; and
   the at least three piezoelectric bender elements in said bender arrangement are arranged on the same bender support to form a segmented bender.

8. The method according to claim 1, where the at least three piezoelectric actuators are piezoelectric bender elements and are arranged in such a manner that the direction from fixed point to moving point of the bender:
   is parallel or in radial alignment for all bender elements; or
   is substantially off radial alignment for all bender elements.

9. The method according to claim 1, where combined stroke length of the at least three piezoelectric actuators is longer than 500 µm.

10. The method according to claim 1, wherein the movable means of an interferometer is selected from: at least one mirror, at least one corner cube mirror, at least one beam splitter, and at least one semi-transparent mirror.

11. The method according to claim 1, wherein the movement of the movable means relative to the interferometer body:
   is 10 µm or more; and
   at a rate of at least 1 movement per second.

12. The method according to claim 1, wherein the velocity of the movable means relative to the interferometer body is at 0.1 mm/s or more.

13. The method according to claim 1, wherein:
   the velocity of the movable means relative to the interferometer body is constant; or
   the velocity of the movable means relative to the interferometer body is variable.

14. The method according to claim 1, wherein the at least one interferometer actuator has a harmonic frequency of 100 Hz or more.

15. The method according to claim 1, wherein:
actuation applied to at least three interferometer actuators differs in time, the result of such different actuation; and
the difference in actuation in time is determined by monitoring an interference signal.

16. The method according to claim 1, where the size of the at least one interferometer actuator in the direction substantially parallel to stroke length is 4 mm or less.

17. The method according to claim 1, wherein the size of the at least one interferometer actuator in the direction substantially perpendicular to the movement of the movable means is:
30 mm or more; or
100 mm or less.

18. The method according to claim 1, wherein the weight of the movable means and interferometer actuator is less than 40 grams.

19. The method according to claim 1, wherein the at least three interferometer actuators are operated individually so that:
each actuator is activated through an independent signal; or
said three or more actuators are fed a substantially identical main signal and at least one of the actuators is also fed a control signal.

20. A system for the movement of at least one movable means of an interferometer relative to the body of the interferometer, comprising:
at least three interferometer piezoelectric actuators, wherein said at least three interferometer piezoelectric actuators are arranged to be operated individually, so that the at least three piezoelectric actuators are capable of moving the at least one movable means of the interferometer;
a means for activating at least one of the at least three interferometer piezoelectric actuators to operate in parallel, thereby moving the at least one movable means of the interferometer with a stroke length of at least 10 μm; and
means for activating at least one other of the at least three interferometer piezoelectric actuators to control the tilt of the at least one movable means.

21. A system according to claim 20, wherein the at least three interferometer actuators that are arranged to be operated individually comprises:
at least one piezoelectric bender; and/or
at least one linear piezoelectric actuator.

22. A system according to claim 21, wherein:
the movement of the at least one movable means of an interferometer is provided by at least three piezoelectric benders in a bender arrangement, where the at least three piezoelectric benders in the bender arrangement are operated in same manner; and
the length of the movement of the at least one movable means of the interferometer relative to the body of the interferometer is equal to the stroke length of the at least one piezoelectric bender in the bender arrangement.

23. A system according to claim 22, where the at least three piezoelectric bender elements are arranged on the same bender support to form a segmented bender.

* * * * *